(12) United States Patent
Lee et al.

(10) Patent No.: US 12,374,663 B2
(45) Date of Patent: Jul. 29, 2025

(54) LIGHT-EMITTING DEVICE AND DISPLAY DEVICE INCLUDING BANK STRUCTURES COMPRISED OF COLOR FILTER MATERIAL

(71) Applicant: SAMSUNG DISPLAY CO., LTD., Yongin-si (KR)

(72) Inventors: Hee Keun Lee, Yongin-si (KR); Tae Jin Kong, Yongin-si (KR); Dae Hyun Kim, Yongin-si (KR); Xinxing Li, Yongin-si (KR); Chang Il Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 623 days.

(21) Appl. No.: 17/272,825

(22) PCT Filed: Feb. 27, 2019

(86) PCT No.: PCT/KR2019/002373
§ 371 (c)(1),
(2) Date: Mar. 2, 2021

(87) PCT Pub. No.: WO2020/050467
PCT Pub. Date: Mar. 12, 2020

(65) Prior Publication Data
US 2021/0217739 A1    Jul. 15, 2021

(30) Foreign Application Priority Data
Sep. 3, 2018  (KR) .................... 10-2018-0104802

(51) Int. Cl.
*H01L 25/075* (2006.01)
*H10D 86/40* (2025.01)
(Continued)

(52) U.S. Cl.
CPC ......... *H01L 25/0753* (2013.01); *H10D 86/40* (2025.01); *H10D 86/60* (2025.01);
(Continued)

(58) Field of Classification Search
CPC . H01L 27/1214; H01L 33/24; H01L 25/0753; H01L 33/4055; H01L 33/50;
(Continued)

(56) References Cited

U.S. PATENT DOCUMENTS 9,419,242 B2   8/2016  Baek et al.
10,216,037 B2  2/2019  Kim et al.
(Continued)

FOREIGN PATENT DOCUMENTS

CN    104218183    12/2014
CN    106486509    3/2017
(Continued)

OTHER PUBLICATIONS

International Search Report, with English translation, corresponding to International Application No. PCT/KR2019/002373 dated Jun. 7, 2019.
(Continued)

*Primary Examiner* — William B Partridge
*Assistant Examiner* — David Paul Sedorook
(74) *Attorney, Agent, or Firm* — KILE PARK REED & HOUTTEMAN PLLC

(57) ABSTRACT

A display device includes a first substrate including a first sub-pixel area, a second sub-pixel area, and a third sub-pixel area; a first sub-pixel including a first light emitting element disposed in the first sub-pixel area; a second sub-pixel including a second light emitting element disposed in the second sub-pixel area; a third sub-pixel including a third light emitting element disposed in the third sub-pixel area; and a bank disposed between the first sub-pixel, the second
(Continued)

sub-pixel, and the third sub-pixel and enclosing an emission area of each of the first sub-pixel, the second sub-pixel, and the third sub-pixel. The bank includes a color bank including a color filter material that blocks light of colors emitted from the first light emitting element, the second light emitting element, and the third light emitting element.

17 Claims, 18 Drawing Sheets

(51) Int. Cl.
| | |
|---|---|
| *H10D 86/60* | (2025.01) |
| *H10H 20/80* | (2025.01) |
| *H10H 20/821* | (2025.01) |
| *H10H 20/832* | (2025.01) |
| *H10H 20/851* | (2025.01) |
| *H10H 20/855* | (2025.01) |
| *H10H 20/857* | (2025.01) |

(52) U.S. Cl.
CPC ........ *H10H 20/821* (2025.01); *H10H 20/835* (2025.01); *H10H 20/851* (2025.01); *H10H 20/855* (2025.01); *H10H 20/857* (2025.01); *H10H 20/882* (2025.01)

(58) Field of Classification Search
CPC . H01L 33/58; H01L 33/62; H01L 2933/0091; H10H 20/821; H10H 20/835; H10H 20/855; H10H 20/857; H10H 20/882; H10H 20/851; H10D 86/40; H10D 86/60
See application file for complete search history.

(56) References Cited

U.S. PATENT DOCUMENTS

| | | | |
|---|---|---|---|
| 10,283,571 B2 | 5/2019 | Kim et al. | |
| 10,367,123 B2 | 7/2019 | Im et al. | |
| 10,446,724 B2 | 10/2019 | Kwon et al. | |
| 10,461,123 B2 | 10/2019 | Kim et al. | |
| 10,650,746 B2 | 5/2020 | Kim et al. | |
| 2004/0012958 A1* | 1/2004 | Hashimoto | H01L 33/60 |
| | | | 257/E33.068 |
| 2006/0267969 A1* | 11/2006 | Doi | G02F 1/133512 |
| | | | 345/204 |
| 2012/0326181 A1* | 12/2012 | Shibata | H01L 25/0753 |
| | | | 257/E33.061 |
| 2013/0187177 A1* | 7/2013 | Nanai | H01L 27/1248 |
| | | | 438/34 |
| 2014/0159043 A1 | 6/2014 | Sakariya et al. | |
| 2014/0353630 A1* | 12/2014 | Baek | H10K 59/38 |
| | | | 257/40 |
| 2014/0374697 A1* | 12/2014 | Liu | H10K 59/12 |
| | | | 438/28 |
| 2017/0062397 A1 | 3/2017 | Park | |
| 2017/0062674 A1 | 3/2017 | Kwon et al. | |
| 2017/0133357 A1 | 5/2017 | Kuo et al. | |
| 2017/0141166 A1 | 5/2017 | Kim et al. | |
| 2017/0154930 A1* | 6/2017 | Kim | H10K 59/38 |
| 2017/0287887 A1 | 10/2017 | Takeya et al. | |
| 2017/0294451 A1 | 10/2017 | Kim et al. | |
| 2017/0294480 A1 | 10/2017 | Kwon | |
| 2018/0175106 A1 | 6/2018 | Kim et al. | |
| 2018/0245773 A1 | 8/2018 | Nishida et al. | |
| 2019/0181301 A1* | 6/2019 | Kim | H01L 33/44 |
| 2019/0207156 A1* | 7/2019 | Gil | H10K 50/844 |
| 2020/0144460 A1* | 5/2020 | Onuma | H01L 25/0753 |
| 2020/0411492 A1* | 12/2020 | Ju | H01L 25/0753 |

FOREIGN PATENT DOCUMENTS

| | | |
|---|---|---|
| KR | 10-2010-0047564 | 5/2010 |
| KR | 10-2014-0141372 | 12/2014 |
| KR | 10-2017-0057502 | 5/2017 |
| KR | 10-2017-0077371 | 7/2017 |
| KR | 10-1797018 | 11/2017 |
| KR | 10-2018-0055021 | 5/2018 |
| KR | 10-2018-0061802 | 6/2018 |
| KR | 10-2018-0066936 | 6/2018 |
| KR | 10-2018-0072909 | 7/2018 |
| KR | 10-2019-0124359 | 11/2019 |

OTHER PUBLICATIONS

Written Opinion, with English translation, corresponding to International Application No. PCT/KR2019/002373 dated Jun. 7, 2019.

\* cited by examiner

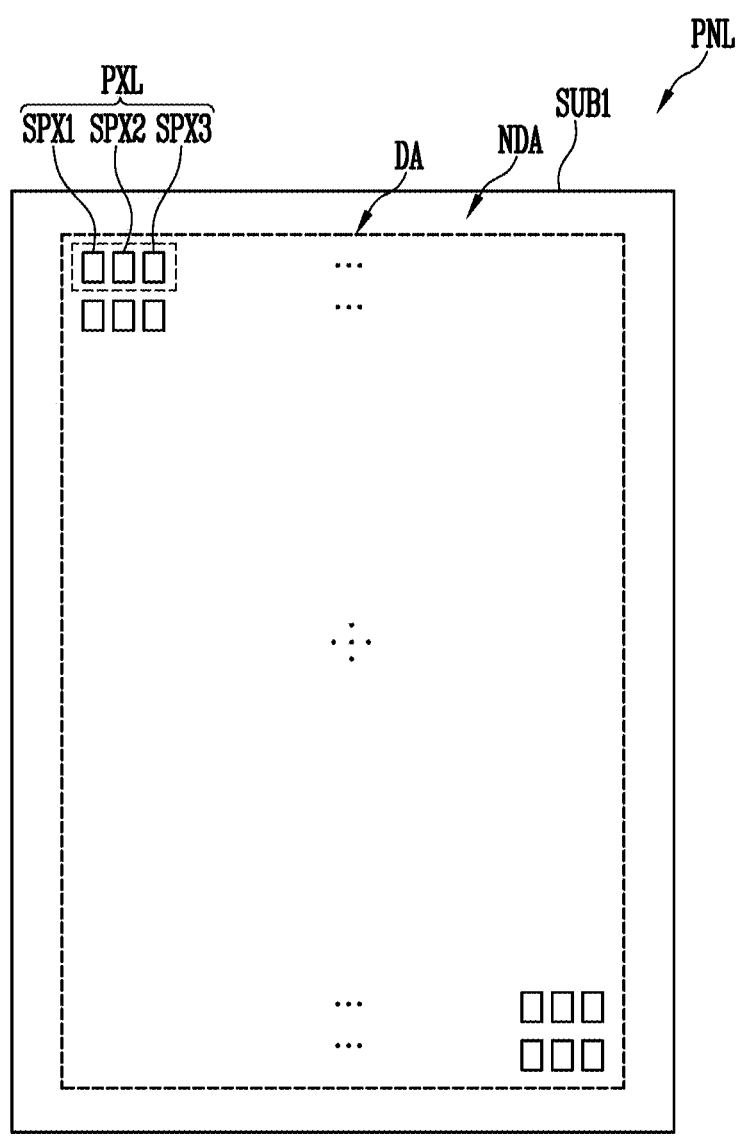

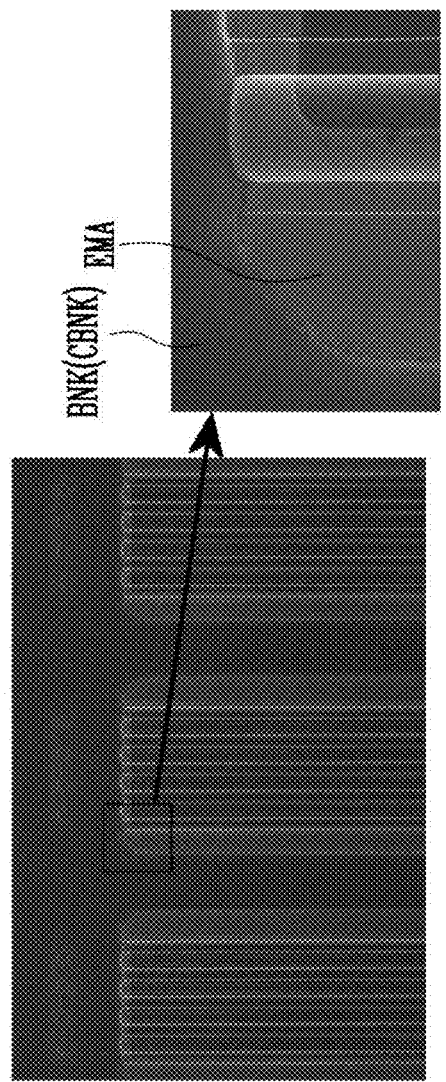

LIGHT-EMITTING DEVICE AND DISPLAY DEVICE INCLUDING BANK STRUCTURES COMPRISED OF COLOR FILTER MATERIAL

CROSS-REFERENCE TO RELATED APPLICATION(S)

This application is a national entry of International Application No. PCT/KR2019/002373, filed on Feb. 27, 2019, which claims under 35 U.S.C. § 119(a) and 365(b) priority to and benefits of Korean Patent Application No. 10-2018-0104802, filed on Sep. 3, 2018 in the Korean Intellectual Property Office, the entire contents of which are incorporated herein by reference.

1. TECHNICAL FIELD

Various embodiments relate to a light emitting device and a display device including the light emitting device.

2. DESCRIPTION OF THE RELATED ART

Recently, a technique of manufacturing a subminiature light emitting element using a material having a reliable inorganic crystal structure and manufacturing a light emitting device using the light emitting element has been developed. For example, a technique of configuring a light source of a light emitting device using subminiature light emitting elements having a small size corresponding to a range from a nano-scale size to a micro-scale size has been developed. Such a light emitting device may be used in various electronic devices such as a display device and a lighting device, for example.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a light emitting device including a bank enclosing each emission area, and a display device including the light emitting device.

According to an aspect of the disclosure, a display device may include a first substrate including a first sub-pixel area, a second sub-pixel area, and a third sub-pixel area; a first sub-pixel including a first light emitting element disposed in the first sub-pixel area; a second sub-pixel including a second light emitting element disposed in the second sub-pixel area; a third sub-pixel including a third light emitting element disposed in the third sub-pixel area; and a bank disposed between the first sub-pixel, the second sub-pixel, and the third sub-pixel and enclosing an emission area of each of the first sub-pixel, the second sub-pixel, and the third sub-pixel. The bank may include a color bank including a color filter material that blocks light of colors emitted from the first light emitting element, the second light emitting element, and the third light emitting element.

In an embodiment, the first light emitting element, the second light emitting element, and the third light emitting element may emit light of an identical color. The bank may include a color pigment of a color different from the colors of the light emitted from the first light emitting element, the second light emitting element, and the third light emitting element.

In an embodiment, the first light emitting element, the second light emitting element, and the third light emitting element may emit blue light. The bank may include a red- or yellow-based color filter material.

In an embodiment, the display device may include a second substrate disposed on a surface of the first substrate; a first color conversion layer disposed on a surface of the second substrate to face the first sub-pixel, and including first color conversion particles that convert a color of light emitted from the first light emitting element to a first color; and a first color filter disposed between the second substrate and the first color conversion layer, wherein light of the first color may selectively pass through the first color filter.

In an embodiment, the display device may further include a second color conversion layer disposed on the surface of the second substrate to face the second sub-pixel, and including second color conversion particles that convert a color of light emitted from the second light emitting element to a second color; and a second color filter disposed between the second substrate and the second color conversion layer, wherein light of the second color may selectively pass through the second color filter.

In an embodiment, the first light emitting element, the second light emitting element, and the third light emitting element may emit blue light. The first color conversion layer and the second color conversion layer may respectively include a red quantum dot and a green quantum dot. The first color filter and the second color filter may respectively comprise a red color filter and a green color filter.

In an embodiment, the display device may further include at least one of a third color filter disposed on the surface of the second substrate to face the third sub-pixel, wherein light of a color emitted from the third light emitting element may selectively pass through the third color filter; and a light scattering layer including light scattering particles, the light scattering layer being disposed between the third sub-pixel and the third color filter.

In an embodiment, the third light emitting element may be a blue light emitting element that may emit blue light. The third color filter may include a blue color filter.

In an embodiment, the display device may further include a black matrix disposed between the first color filter, the second color filter, and the third color filter.

In an embodiment, each of the first sub-pixel, the second sub-pixel, and the third sub-pixel may include a first partition wall and a second partition wall spaced apart from each other and disposed in the emission area of the first sub-pixel, the second sub-pixel, and the third sub-pixel; a first electrode disposed on the first partition wall; a second electrode disposed on the second partition wall and spaced apart from the first electrode; a first contact electrode disposed over a first end of the first light emitting element, the second light emitting element, or the third light emitting element and an area of the first electrode to electrically connect the first end of the first light emitting element, the second light emitting element, or the third light emitting element to the first electrode; and a second contact electrode disposed over a second end of the first light emitting element, the second light emitting element, or the third light emitting element and an area of the second electrode to electrically connect the second end of the first light emitting element, the second light emitting element, or the third light emitting element to the second electrode.

In an embodiment, the first partition wall and the second partition wall each may have a height less than a height of the bank.

In an embodiment, the first electrode may include a first reflective electrode protruding in a height direction of the first substrate and having an inclined surface or a curved surface facing the first end of the first light emitting element, the second light emitting element, or the third light emitting element. The second electrode may include a second reflective electrode protruding in the height direction of the first substrate and having an inclined surface or a curved surface facing the second end of the first light emitting element, the second light emitting element, or the third light emitting element.

In an embodiment, the bank may include a first color bank layer including a first color pigment and disposed on a surface of the first substrate; and a second color bank layer including a second color pigment and disposed over or below the first color bank layer to overlap the first color bank layer, the second color pigment being a different color from a color of the first color pigment.

In an embodiment, the bank may include a first color bank layer including a first color pigment and disposed on a surface of the first substrate; and a polymer organic bank layer disposed over or below the first color bank layer to overlap the first color bank layer.

In an embodiment, each of the first light emitting element, the second light emitting element, and the third light emitting element may include a nano-scale or micro-scale size rod shape light emitting diode.

According to an aspect of the disclosure, a light emitting device may include a first substrate including an emission area; a first partition wall and a second partition wall spaced apart from each other and disposed in the emission area; a first electrode disposed on the first partition wall; a second electrode disposed on the second partition wall and spaced apart from the first electrode; a light emitting element electrically connected between the first electrode and the second electrode; and a bank that encloses the emission area. The bank may include a color bank including a color filter material that may block light of a color emitted from the light emitting element.

In an embodiment, the light emitting element may emit blue light. The bank may include a red- or yellow-based color filter material.

In an embodiment, the light emitting device may further include a second substrate disposed on a surface of the first substrate; a color conversion layer disposed on a surface of the second substrate to face the light emitting element, and including color conversion particles that convert the color of the light emitted from the light emitting element to a different color; and a color filter that may allow light of the color converted by the color conversion layer to pass through the color filter.

In an embodiment, the bank may include a first color bank layer including a first color pigment and disposed on a surface of the first substrate; and a second color bank layer including a second color pigment and disposed over or below the first color bank layer to overlap the first color bank layer, the second color pigment being a different color from a color of the first color pigment.

In an embodiment, the bank may include a first color bank layer including a first color pigment and disposed on a surface of the first substrate; and a polymer organic bank layer disposed over or below the first color bank layer to overlap the first color bank layer.

A light emitting device in accordance with an embodiment and a display device including the same may include a bank that may enclose each emission area in which at least one light emitting element may be disposed. By way of example, in an embodiment, the bank may be formed of a color bank including a color filter material for blocking light of a color emitted from each corresponding light emitting element. According to an embodiment, residues of the bank may be prevented from remaining, and the bank may be easily formed in a desired shape. In addition, optical interference between adjacent light emitting devices or pixels may be effectively prevented.

BRIEF DESCRIPTION OF THE DRAWINGS

The above and other features of the disclosure will become more apparent by describing in further detail embodiments thereof with reference to the accompanying drawings, in which:

FIG. 4 is a plan view illustrating a display device in accordance with an embodiment.

FIGS. 9A to 9D illustrate electron microscope images of a display device of a comparative example including a black bank and a display device including a color bank in accordance with an embodiment.

DETAILED DESCRIPTION OF THE EMBODIMENTS

Figure 1A:
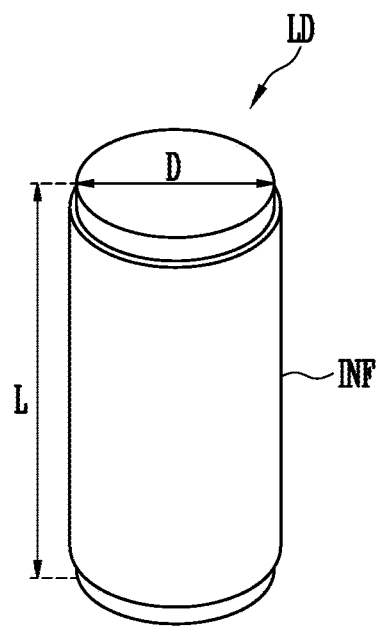
FIGS. 1A and 1B are respectively a perspective diagram and a sectional diagram illustrating a light emitting element in accordance with an embodiment.

Reference will now be made in detail to various embodiments, examples of which are illustrated in the accompanying drawings and described below, since embodiments of the disclosure may be variously modified in many different forms. However, the disclosure is not limited to the following embodiments and may be modified into various forms.

Some elements which may not be directly related to the features of the disclosure in the drawings may be omitted for clarity. Furthermore, the sizes, ratios, etc. of some elements in the drawings may be slightly exaggerated. It should be noted that the same reference numerals are used to designate the same or similar elements throughout the drawings, and repetitive explanation may be omitted.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that, although the terms "first", "second", etc. may be used herein to describe various elements, these elements should not be limited by these terms. These terms are only used to distinguish one element from another element. Thus, a first element discussed below could be termed a second element without departing from the teachings of the disclosure.

It will be further understood that the terms "comprise", "include", "have", and their variations when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first part such as a layer, a film, a region, or a plate is disposed on a second part, the first part may be not only directly on the second part but a third part may intervene between them. Furthermore, the term "position", "direction", etc. used in the following description are defined in relative terms, and it should be noted that they may be changed into a reverse position or direction depending on a view angle or direction.

In the disclosure, it will be understood that when an element or layer is referred to as being "on", "connected to" or "coupled to" another element or layer, it may be directly on, connected or coupled to the other element or layer or intervening elements or layers may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments and details of the disclosure are described with reference to the accompanying drawings in order to describe the disclosure in detail so that those of ordinary skill in the art to which the disclosure pertains may practice the disclosure. A singular expression in the description is not limited to being singular but may represent plural unless otherwise specifically defined in a sentence.

FIGS. 1A, 1B, 2A, 2B, 3A, and 3B are perspective and sectional diagrams illustrating light emitting elements LD in accordance with embodiments. Although FIGS. 1A to 3B illustrate cylindrical rod-type light emitting elements LD, the kind and/or shape of the light emitting elements LD in accordance with the disclosure is not limited thereto.

Figure 1B:
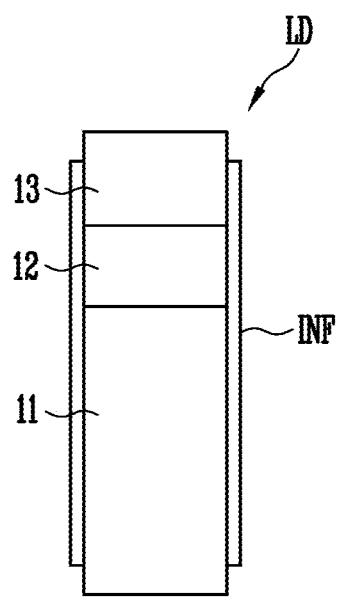

Referring to FIGS. 1A and 1B, a light emitting element LD in accordance with an embodiment may include a first conductive semiconductor layer (or referred to as a first semiconductor layer) 11, a second conductive semiconductor layer (or referred to as a second semiconductor layer) 13, and an active layer 12 interposed between the first and second conductive semiconductor layers 11 and 13. For example, the light emitting element LD may be configured of a stacked body formed by successively stacking the first conductive semiconductor layer 11, the active layer 12, and the second conductive semiconductor layer 13.

In an embodiment, the light emitting element LD may be provided in the form of a rod extending in one direction. If the direction in which the light emitting element LD extends is defined as a longitudinal direction, the light emitting element LD may have a first end and a second end with respect to the longitudinal direction.

In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be a rod-type light emitting diode manufactured substantially in the form of a rod. In this specification, the term "rod-type" embraces a substantially rod-like shape and a substantially bar-like shape such as a substantially cylindrical shape and a substantially prismatic shape extending in a longitudinal direction (for example, to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size corresponding to a nano-scale size to a micro-scale size, for example, a diameter D and/or a length L corresponding to a micro-scale to nano-scale range. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductive semiconductor layer 11 may include, for example, at least one n-type semiconductor layer. For instance, the first conductive semiconductor layer 11 may include an n-type semiconductor layer which may include any one semiconductor material of InAlGaN, GaN, AlGaN, InGaN, AlN, and InN, and is doped with a first conductive dopant such as Si, Ge, or Sn. However, the material forming the first conductive semiconductor layer 11 is not limited to this, and the first conductive semiconductor layer 11 may be formed of various other materials.

The active layer 12 may be disposed on the first conductive semiconductor layer 11 and have a single or multiple quantum well structure. In an embodiment, a cladding layer (not shown) doped with a conductive dopant may be formed or disposed on and/or under or below the active layer 12. For example, the cladding layer may be formed of an ALGaN layer or an InALGaN layer. In an embodiment, a material such as AlGaN or AlInGaN may be used to form the active layer 12, and various other materials may be used to form the active layer 12.

If an electric field having a predetermined voltage or more is applied to the opposite ends of the light emitting element LD, the light emitting element LD emits light by coupling of electron-hole pairs in the active layer 12. Since light emission of the light emitting element LD may be controlled based on the foregoing principle, the light emitting element LD may be used as a light source of various light emitting devices as well as a pixel of the display device.

The second conductive semiconductor layer 13 may be disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which may include any one semiconductor material of InAlGaN, GaN, AlGaN, InGaN, AlN, and InN, and is doped with a second conductive dopant such as Mg. However, the material forming the second conductive semiconductor layer 13 is not limited to this, and the second conductive semiconductor layer 13 may be formed of various other materials.

In an embodiment, the light emitting element LD may further include an insulating film INF provided on the surface of the light emitting element LD. In an embodiment, the insulating film INF may be formed or disposed on the surface of the light emitting element LD to enclose an outer circumferential surface of at least the active layer 12. For example, the insulating film INF may further enclose at least an area of each of the first and second conductive semiconductor layers 11 and 13. Here, the insulating film INF may allow the opposite ends of the light emitting element LD that have different polarities to be exposed to the outside. For example, the insulating film INF may expose one or an end of each of the first and second conductive semiconductor layers 11 and 13 that may be disposed on the respective opposite ends of the light emitting element LD with respect to the longitudinal direction, for example, may expose each of the top and bottom surfaces of the cylinder rather than covering or overlapping it.

In an embodiment, the insulating film INF may include at least one insulating material of $SiO_2$, $Si_3N_4$, $Al_2O_3$, and $TiO_2$, but it is not limited thereto. In other words, the material forming the insulating film INF is not limited to a particular material, and the insulating film INF may be formed of various insulating materials.

In an embodiment, the light emitting element LD may further include additional other components as well as the first conductive semiconductor layer 11, the active layer 12, the second conductive semiconductor layer 13, and/or the insulating film INF. For example, the light emitting element LD may further include one or more fluorescent layers, one or more active layers, one or more semiconductor layers, and/or one or more electrode layers disposed on one end of the first conductive semiconductor layer 11, the active layer 12, and/or the second conductive semiconductor layer 13.

Figure 2A:
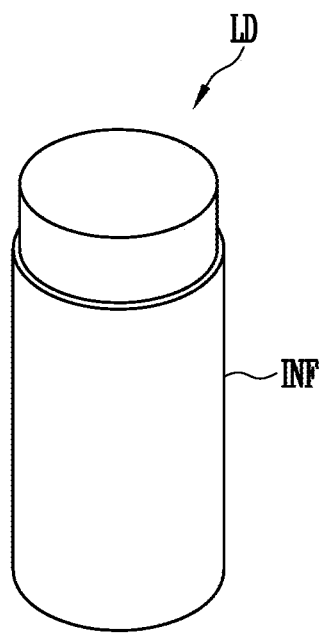
FIGS. 2A and 2B are respectively a perspective diagram and a sectional diagram illustrating a light emitting element in accordance with an embodiment.
Figure 2B:
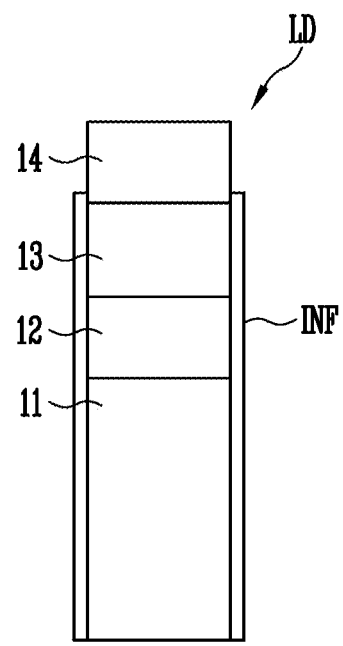
Figure 3A:
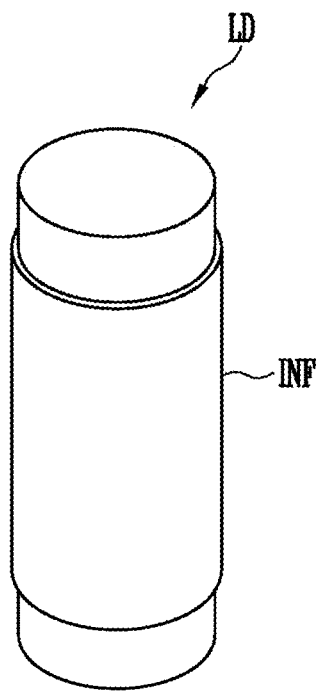
FIGS. 3A and 3B are respectively a perspective diagram and a sectional diagram illustrating a light emitting element in accordance with an embodiment.
Figure 3B:
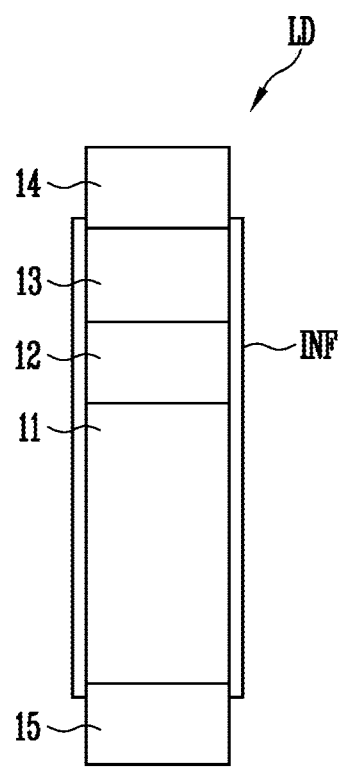

For example, as illustrated in FIGS. 2A and 2B, the light emitting element LD may further include at least one electrode layer 14 disposed on one end of the second conductive semiconductor layer 13. In an embodiment, as illustrated in FIGS. 3A and 3B, the light emitting element LD may further include at least one electrode layer 15 disposed on one end of the first conductive semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer surfaces of the electrode layers 14 and 15, or may not enclose them. In other words, the insulating film INF may be selectively formed or disposed on the surfaces of the electrode layers 14 and 15. Furthermore, the insulating layer INF may be formed or disposed to expose the opposite ends of the light emitting element LD that have different polarities, for example, may expose at least an area of each of the electrode layers 14 and 15. Alternatively, in an embodiment, the insulating film INF may not be provided.

If the insulating film INF is provided on the surface of the light emitting element LD, for example, on the surface of the active layer 12, the active layer 12 may be prevented from short-circuiting with at least one electrode which is not shown (for example, at least one contact electrode of contact electrodes electrically connected or coupled to the opposite ends of the light emitting element LD), for example. Consequently, the electrical stability of the light emitting element LD may be secured.

Furthermore, thanks to the insulating film INF formed or disposed on the surface of the light emitting element LD, occurrence of a defect on the surface of the light emitting element LD may be minimized, whereby the lifetime and efficiency of the light emitting element LD may be improved. For example, if the insulating film INF is formed or disposed on each light emitting element LD, even in a case that a plurality of light emitting elements LD may be disposed adjacent to each other, the light emitting elements LD may be prevented from undesirably short-circuiting.

In an embodiment, a surface treatment process may be performed to fabricate the light emitting element LD. For example, the light emitting element LD may be surface-treated (for example, through a coating process) so that, in a case that a plurality of light emitting elements LD are mixed with a fluidic solution and then supplied to each light emitting area (for example, a light emitting area of each pixel), the light emitting elements LD may be evenly distributed rather than unevenly aggregating in the solution.

A light emitting device including the light emitting element LD described above may be used in various devices including a display device which requires alight source. For example, a plurality of subminiature light emitting elements LD may be disposed in each pixel area of a display panel, thereby forming a light emitting unit of each pixel. Furthermore, the field of application of the light emitting element LD according to the disclosure is not limited to a display device. For example, the light emitting element LD may also be used in various devices such as a lighting device, which requires a light source.

FIG. 4 is a plan view illustrating a display device in accordance with an embodiment. In an embodiment, FIG. 4 illustrates a display device, for example, a display panel PNL provided in the display device, as an example of a device which may use, as a light source, the light emitting elements LD described with reference to FIGS. 1A to 3B. In accordance with an embodiment, FIG. 4 simply illustrates the structure of the display panel PNL, focusing on a display area DA. In an embodiment, although not illustrated, at least one driving circuit component (for example, at least one of a scan driver and a data driver) and/or a plurality of lines may be further provided or disposed on the display panel PNL.

Referring to FIG. 4, the display panel PNL in accordance with an embodiment may include a first substrate SUB1, and a plurality of pixels PXL disposed on the first substrate SUB1. In detail, the display panel PNL and the first substrate SUB1 for forming the display panel PNL may include a display area DA for displaying an image, and a non-display area NDA which is other than the display area DA.

In an embodiment, the display area DA may be disposed in a central portion of the display panel PNL, and the non-display area NDA may be disposed in a perimeter portion of the display panel PNL in such a way as to enclose the display area DA. The locations of the display area DA and the non-display area NDA are not limited to this, and the locations thereof may be changed.

The first substrate SUB1 may form abase member of the display panel PNL. For example, the first substrate SUB1 may form a base of a bottom panel (a bottom plate of the display panel PNL).

In an embodiment, the first substrate SUB1 may be a rigid substrate or a flexible substrate, and the material or properties thereof are not particularly limited. For example, the first substrate SUB1 may be a rigid substrate made of glass or reinforced glass, or a flexible substrate formed of a thin film made of plastic or metal. Furthermore, the first substrate SUB1 may be a transparent substrate, but it is not limited thereto. For instance, the first substrate SUB1 may be a translucent substrate, an opaque substrate, or a reflective substrate.

An area on the first substrate SUB1 is defined as the display area DA in which the pixels PXL are disposed, and the other area thereof is defined as the non-display area NDA. For example, the first substrate SUB1 may include the display area DA including a plurality of pixel areas on which the respective pixels PXL may be formed or disposed, and the non-display area NDA disposed around the display area DA. Various lines and/or internal circuits which may be electrically connected or coupled to the pixels PXL may be disposed in the non-display area NDA.

Each of the pixels PXL may include at least one light emitting element LD (for example, at least one rod-type light emitting diode according to any one of embodiments shown in FIGS. 1A to 3B) which is driven by a corresponding scan signal and a corresponding data signal. For example, the pixels PXL each may include a plurality of rod-type light emitting diodes, each of which has a small size ranging from a nano-scale to a micro-scale, and which may be electrically connected or coupled parallel to each other. The plurality of rod-type light emitting diodes may form a light source of each pixel PXL.

Furthermore, each of the pixels PXL may include a plurality of sub-pixels. For example, each pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 4 there is illustrated an embodiment where the pixels PXL may be arranged or disposed in the display area DA in a substantially stripe shape, the disclosure is not limited thereto. For instance, the display area DA may have various pixel arrangement shapes.

In an embodiment, each pixel PXL (or each sub-pixel) may be formed of an active pixel. However, the types, structures, and/or driving schemes of the pixels PXL capable of being applied to the display device according to the disclosure are not particularly limited. For example, each pixel PXL may be formed of a pixel of a light emitting display device which may have various active or passive structures.

Figure 5A:
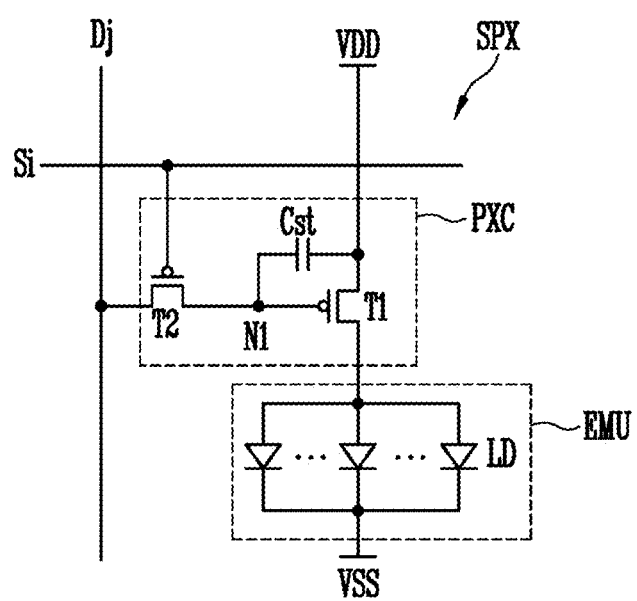
FIGS. 5A to 5C are equivalent circuit diagrams each illustrating a sub-pixel in accordance with an embodiment.
Figure 5B:
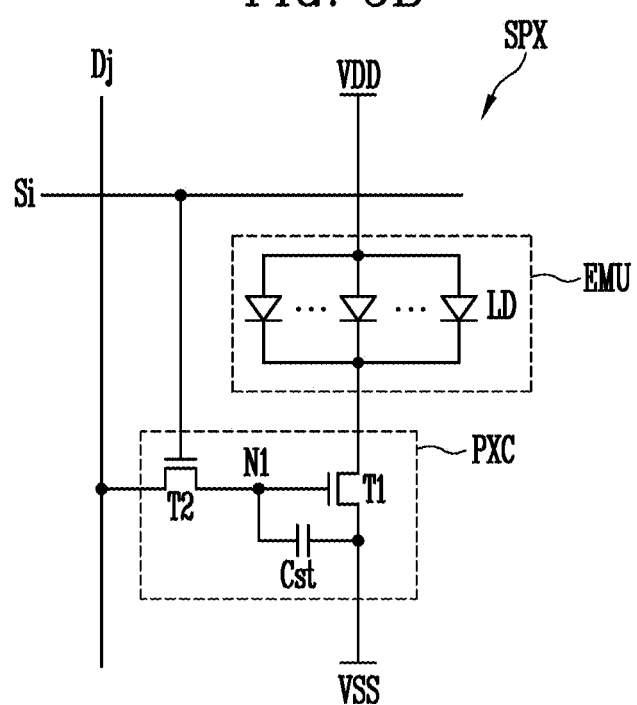
Figure 5C:
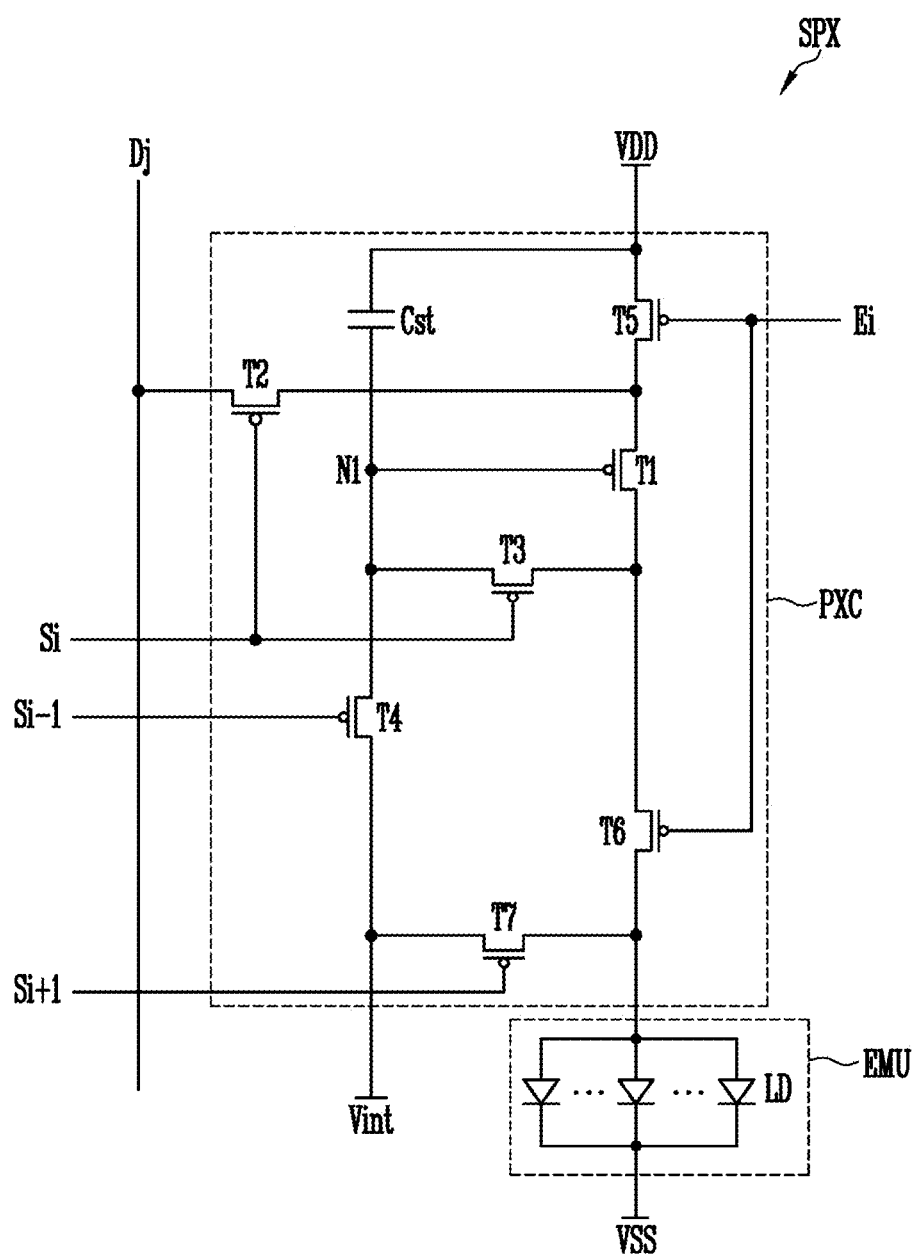

FIGS. 5A to 5C are equivalent circuit diagrams each illustrating a sub-pixel in accordance with an embodiment, for example, to illustrate any one of the first, second, and third sub-pixels SPX1, SPX2, and SPX3 shown in FIG. 4.

In detail, FIGS. 5A to 5C illustrate different embodiments of a sub-pixel SPX which may be provided in an active display device (for example, an active light emitting display device). For example, each sub-pixel SPX shown in FIGS. 5A to 5C may be any one of the first, second, and third sub-pixels SPX1, SPX2, and SPX3 provided in the light emitting display panel PNL of FIG. 4. The structures of the first, second, and third sub-pixels SPX1, SPX2, and SPX3 may be substantially identical or similar to each other. Therefore, in FIGS. 5A to 5C, the first, second, and third sub-pixels SPX1, SPX2, and SPX3 may be collectively referred to as a sub-pixel SPX.

Referring to FIG. 5A, the sub-pixel SPX in accordance with an embodiment may include a light emitting unit EMU that may generate light having a luminance corresponding to a data signal, and a pixel circuit PXC that may drive the light emitting unit EMU.

In an embodiment, the light emitting unit EMU may include a plurality of light emitting elements LD electrically connected or coupled parallel to each other between first and second power supplies VDD and VSS. Here, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the sub-pixel SPX.

Although in FIG. 5A there is illustrated an embodiment in which the light emitting elements LD forming the light emitting unit EMU may be electrically connected or coupled parallel to each other in the same direction (for example, in a forward direction) between the first power supply VDD and the second power supply VSS, the disclosure is not limited to this. For example, in an embodiment, some or a predetermined number of the light emitting elements LD may be electrically connected or coupled to each other in the forward direction between the first and second power supplies VDD and VSS, and the other light emitting elements LD may be electrically connected or coupled to each other in the reverse direction. Alternatively, in an embodiment, at least one sub-pixel SPX may include a single light emitting element LD.

In an embodiment, first ends of the light emitting elements LD forming each light emitting unit EMU may be electrically connected or coupled in common to a corresponding pixel circuit PXC through a first electrode and may be electrically connected or coupled to the first power supply VDD through the pixel circuit PXC. Second ends of the light emitting elements LD may be electrically connected or coupled in common to the second power supply VSS through a second electrode.

Each light emitting unit EMU may emit light having luminance corresponding to driving current supplied thereto through the corresponding pixel circuit PXC. Thereby, a predetermined image may be displayed on the display area DA.

The pixel circuit PXC may be electrically connected or coupled to a scan line Si and a data line Dj of the corresponding sub-pixel SPX. For example, if the sub-pixel SPX is disposed on an i-th row and a j-th column of the display area DA, the pixel circuit PXC of the sub-pixel SPX may be electrically connected or coupled to the i-th scan line Si and the j-th data line Dj of the display area DA. The pixel circuit PXC may include a first transistor T1, a second transistor T2, and a storage capacitor Cst.

The first transistor (driving transistor) T1 may be electrically connected or coupled between the first power supply VDD and the first electrode of the light emitting unit EMU. A gate electrode of the first transistor T1 may be electrically connected or coupled to a first node N1. The first transistor T1 may control driving current to be supplied to the light emitting unit EMU in response to a voltage of the first node N1.

The second transistor (switching transistor) T2 may be electrically connected or coupled between the data line Dj and the first node N1. A gate electrode of the second transistor T2 may be electrically connected or coupled to the scan line Si.

When a scan signal of a gate-on voltage (for example, a low voltage) is supplied from the scan line Si, the second transistor T2 is turned on to electrically connect or couple the first node N1 to the data line Dj. During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst may be electrically connected or coupled to the first power supply VDD, and the other electrode thereof may be electrically connected or coupled to the first node N1. The storage capacitor Cst may charge voltage corresponding to a data signal supplied to the first node N1 during each frame period, and maintain the charged voltage until a data signal of a subsequent frame is supplied.

Although in FIG. 5A the transistors, for example, the first and second transistors T1 and T2, included in the pixel circuit PXC have been illustrated as being formed of P-type transistors, the disclosure is not limited to this. In other words, any one of the first and second transistors T1 and T2 may be changed to an N-type transistor.

For example, as shown in FIG. 5B, both the first and second transistors T1 and T2 may be formed of N-type transistors. The configuration and operation of the sub-pixel SPX shown in FIG. 5B, other than the fact that connection positions of some or a predetermined number of circuit elements have been changed depending on a change in type of the transistors, may be substantially similar to those of the sub-pixel SPX of FIG. 5A. Therefore, detailed description of the sub-pixel SPX of FIG. 5B may be omitted.

The structure of the pixel circuit PXC is not limited to an embodiment shown in FIGS. 5A and 5B. In other words, the pixel circuit PXC may be formed of a pixel circuit which may have various structures and/or be operated by various driving schemes. For example, the pixel circuit PXC may be configured or formed in the same manner as that of an embodiment illustrated in FIG. 5C.

Referring to FIG. 5C, the pixel circuit PXC may be electrically connected or coupled not only to a scan line Si of a corresponding horizontal line but also to at least one another scan line (or a control line). For example, the pixel circuit PXC of the sub-pixel SPX disposed on the i-th row of the display area DA may be further electrically connected or coupled to an i−1-th scan line Si-1 and/or an i+1-th scan line Si+1. In an embodiment, the pixel circuit PXC may be electrically connected or coupled not only to the first and second power supplies VDD and VSS but also to other power supplies. For instance, the pixel circuit PXC may also be electrically connected or coupled to an initialization power supply Vint. In an embodiment, the pixel circuit PXC may include first to seventh transistors T1 to T7 and a storage capacitor Cst.

The first transistor T1 may be electrically connected or coupled between the first power supply VDD and the first electrode of the light emitting unit EMU. A gate electrode of the first transistor T1 may be electrically connected or coupled to a first node N1. The first transistor T1 may control driving current to be supplied to the light emitting unit EMU in response to a voltage of the first node N1.

The second transistor T2 may be electrically connected or coupled between the data line Dj and one electrode of the first transistor T1. A gate electrode of the second transistor T2 may be electrically connected or coupled to the corresponding scan line Si. When a scan signal of a gate-on voltage is supplied from the scan line Si, the second transistor T2 may be turned on to electrically connect the data line Dj to the one electrode of the first transistor T1. Hence, if the second transistor T2 is turned on, a data signal supplied from the data line Dj may be transmitted to the first transistor T1.

The third transistor T3 may be electrically connected or coupled between the other electrode of the first transistor T1 and the first node N1. A gate electrode of the third transistor T3 may be electrically connected or coupled to the corresponding scan line Si. When a scan signal of a gate-on voltage is supplied from the scan line Si, the third transistor T3 may be turned on to electrically connect the first transistor T1 in the form of a diode.

The fourth transistor T4 may be electrically connected or coupled between the first node N1 and an initialization power supply Vint. A gate electrode of the fourth transistor T4 may be electrically connected or coupled to a preceding scan line, for example, an i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be electrically connected or coupled between the first power supply VDD and the first transistor T1. A gate electrode of the fifth transistor T5 may be electrically connected or coupled to a corresponding emission control line, for example, an i-th emission control line Ei. The fifth transistor T5 may be turned off when an emission control signal of a gate-off voltage (for example, a high voltage) is supplied to the emission control line Ei, and may be turned on in other cases.

The sixth transistor T6 may be electrically connected or coupled between the first transistor T1 and the first electrode of the light emitting unit EMU. A gate electrode of the sixth transistor T6 may be electrically connected or coupled to a corresponding emission control line, for example, the i-th emission control line Ei. The sixth transistor T6 may be turned off when an emission control signal of a gate-off voltage is supplied to the emission control line Ei, and may be turned on in other cases.

The seventh transistor T7 may be electrically connected between the first electrode of the light emitting unit EMU and the initialization power supply Vint. A gate electrode of the seventh transistor T7 may be electrically connected or coupled to any one of scan lines of a subsequent stage, for example, to the i+i-th scan line Si+1. When a scan signal of a gate-on voltage is supplied to the i+i-th scan line Si+1, the seventh transistor T7 may be turned on so that the voltage of the initialization power supply Vint may be supplied to the first electrode of the light emitting unit EMU.

The storage capacitor Cst may be electrically connected or coupled between the first power supply VDD and the first node N1. The storage capacitor Cst may store a voltage corresponding both to the data signal applied to the first node N1 during each frame period and to the threshold voltage of the first transistor T1.

Although in FIG. 5C the transistors included in the pixel circuit PXC, for example, the first to seventh transistors T1 to T7, have been illustrated as being formed of P-type transistors, the disclosure is not limited to this. For example, at least one of the first to seventh transistors Ti to T7 may be changed to an N-type transistor.

Furthermore, the structure of the sub-pixel SPX which may be applied to the disclosure is not limited to embodiments shown in FIGS. 5A to 5C, and each sub-pixel SPX may have various structures. For example, the pixel circuit PXC included in each sub-pixel SPX may be formed of a pixel circuit which may have various structures and/or be operated by various driving schemes. In an embodiment, each sub-pixel SPX may be a passive light emitting display device or the like within the spirit and the scope of the disclosure. In this case, the pixel circuit PXC may be omitted, and each of the first and second pixel electrodes of the light emitting unit EMU may be directly electrically connected or coupled to the scan line Si, the data line Dj, a power line, and/or the control line.

Figure 6:
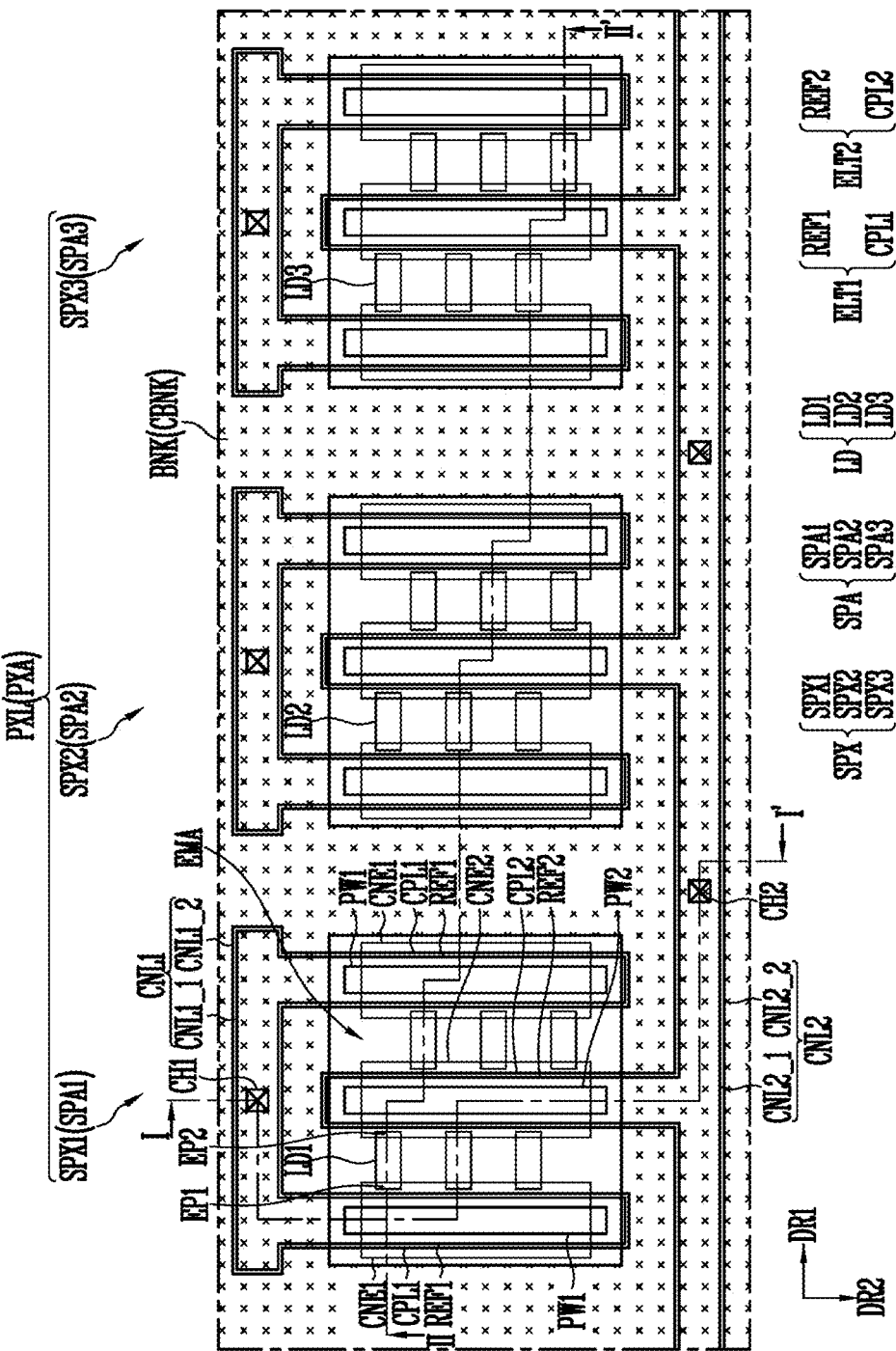
FIG. 6 is a plan diagram illustrating a pixel in accordance with an embodiment.

FIG. 6 is a plan diagram illustrating a pixel PXL in accordance with an embodiment, for example, a plan diagram illustrating a pixel area PXA corresponding to any one of pixels PXL illustrated in FIG. 4. In an embodiment, FIG. 6 illustrates the structure of each pixel PXL, focused on a display element layer on which the light emitting elements LD of the pixel PXL are disposed.

Referring to FIGS. 4 to 6, a pixel PXL may be formed or disposed in each pixel area PXA defined on the first substrate SUB1. Each pixel area PXA may include a plurality of sub-pixel areas SPA corresponding to a plurality of sub-pixels SPX constituting each pixel PXL.

For example, each pixel area PXA may include a first sub-pixel area SPA1 in which a first sub-pixel SPX1 may be formed or disposed, a second sub-pixel area SPA2 in which a second sub-pixel SPX2 may be formed or disposed, and a third sub-pixel area SPA3 in which a third sub-pixel SPX3 may be formed or disposed. Each sub-pixel area SPA may include at least one pair of first pixel electrode ELT1 and second electrode ELT2, and an emission area EMA in which at least one light emitting element LD electrically connected or coupled between the first and second electrodes ELT1 and ELT2 may be disposed.

In an embodiment, the first sub-pixel SPX1 may include a first electrode ELT1 and a second electrode ELT2 disposed at positions spaced apart from each other in the first sub-pixel area SPA1 corresponding to the first sub-pixel SPX1, and at least one first light emitting element LD1 electrically connected or coupled between the first and second electrodes ELT1 and ELT2. For example, the first sub-pixel SPX1 may include a plurality of first light emitting elements LD1 electrically connected or coupled in parallel to each other between the first and second electrodes ELT1 and ELT2.

In an embodiment, the second sub-pixel SPX2 may include a first electrode ELT1 and a second electrode ELT2 disposed at positions spaced apart from each other in the second sub-pixel area SPA2 corresponding to the second sub-pixel SPX2, and at least one second light emitting element LD2 electrically connected or coupled between the first and second electrodes ELT1 and ELT2. For example, the second sub-pixel SPX2 may include a plurality of second light emitting elements LD2 electrically connected or coupled in parallel to each other between the first and second electrodes ELT1 and ELT2.

In an embodiment, the third sub-pixel SPX3 may include a first electrode ELT1 and a second electrode ELT2 disposed at positions spaced apart from each other in the third sub-pixel area SPA3 corresponding to the third sub-pixel SPX3, and at least one third light emitting element LD3 electrically connected or coupled between the first and second electrodes ELT1 and ELT2. For example, the third sub-pixel SPX3 may include a plurality of third light emitting elements LD3 electrically connected or coupled in parallel to each other between the first and second electrodes ELT1 and ELT2.

In an embodiment, the structures of the first, second, and third sub-pixels SPX1, SPX2, and SPX3 may be substantially identical or similar to each other. For the convenience sake, hereinafter, any one of the first, second, and third sub-pixels SPX1, SPX2, and SPX3 may be collectively designated as "sub-pixel SPX", an area in which the sub-pixel SPX may be formed or disposed may be collectively designated as "sub-pixel area SPA", at least one first, second, or third light emitting element LD1, LD2, or LD3 disposed in the sub-pixel area SPA may be collectively designated as "light emitting element LD", and the structure of each sub-pixel SPX will be described in detail.

In an embodiment, each sub-pixel SPX may include at least one pair of first electrode ELT1 and second electrode ELT2 disposed at positions spaced apart from each other in each sub-pixel area SPA, a first partition wall (or referred to as a first wall, a first bank, or a first pattern) PW1 and a first contact electrode CNE1 which overlap with one area of the first electrode ELT1, a second partition wall (or referred to as a second wall, a second bank, or a second pattern) PW2 and a second contact electrode CNE2 which overlap with one area of the second electrode ELT2, and at least one light emitting element LD (for example, a plurality of light emitting elements LD) electrically connected or coupled between the first and second electrodes ELT1 and ELT2.

In an embodiment, the first electrode ELT1 and the second electrode ELT2 may be disposed at positions spaced apart from each other in each sub-pixel area SPA such that at least portions thereof face each other. For example, the first and second electrodes ELT1 and ELT2 may be disposed in parallel to each other in each emission area EMA at positions spaced apart from each other by a predetermined distance with respect to the first direction DR1, and each may extend in the second direction DR2 intersecting with the first direction DR1. However, the disclosure is not limited thereto. For example, the shapes and/or mutual arrangement relationship of the first and second electrodes ELT1 and ELT2 may be changed in various ways.

In an embodiment, each of the first and second electrodes ELT1 and ELT2 may have a single-layer or multi-layer structure. For example, each first electrode ELT1 may have a multi-layer structure including a first reflective electrode REF1 and a first conductive capping layer CPL1. Each second electrode ELT2 may have a multi-layer structure including a second reflective electrode REF2 and a second conductive capping layer CPL2.

Furthermore, each of the first and second reflective electrodes REF1 and REF2 may have a single-layer or multi-layer structure. For example, each first reflective electrode REF1 may include at least one reflective conductive layer, and selectively further include at least one transparent conductive layer disposed over and/or under or below the reflective conductive layer. Similarly, each second reflective electrode REF2 may include at least one reflective conductive layer, and selectively further include at least one transparent conductive layer disposed over and/or under or below the reflective conductive layer.

In an embodiment, the first electrode ELT1 may be electrically connected or coupled to a first connection electrode CNL1. For instance, the first electrode ELT1 may be integrally coupled to the first connection electrode CNL1. For example, the first electrode ELT1 may be formed of at least one branch diverging from the first connection electrode CNL1. In the case where the first electrode ELT1 and the first connection electrode CNL1 may be formed integrally with each other, the first connection electrode CNL1 may be regarded as an area of the first electrode ELT1. However, the disclosure is not limited thereto. For example, in an embodiment, the first electrode ELT1 and the first connection electrode CNL1 may be individually formed and electrically connected or coupled to each other through at least one contact hole, via hole, or the like, which is not illustrated.

In an embodiment, the first electrode ELT1 and the first connection electrode CNL1 may extend in different directions in the corresponding sub-pixel area SPA. For example, when the first connection electrode CNL1 extends in the first direction DR1, the first electrode ELT1 may extend in the second direction DR2 intersecting with the first direction DR1.

In an embodiment, the first connection electrode CNL1 may have a single-layer or multi-layer structure. For example, the first connection electrode CNL1 may include a 1_1-th connection electrode CNL1_1 integrally coupled with the first reflective electrode REF1, and a 1_2-th connection electrode CNL1_2 integrally coupled with the first conductive capping layer CPL1. In an embodiment, the first connection electrode CNL1 may have the same cross-sectional structure (stacked structure) as that of the first electrode ELT1, but the disclosure is not limited thereto.

In an embodiment, the first electrode ELT1 and the first connection electrode CNL1 may be electrically connected or coupled, through a first contact hole CH1, to a pixel circuit PXC of each sub-pixel SPX, for example, a pixel circuit PXC having a configuration illustrated in any one of FIGS. 5A to 5C. In an embodiment, the first contact hole CH1 may be disposed outside the emission area EMA of each sub-pixel SPX. For example, the first contact hole CH1 may be disposed around the corresponding emission area EMA such that the first contact hole CH1 overlaps with the bank BNK. In this case, the first contact hole CH1 may be covered with or may be overlapped by the bank BNK, so that a pattern may be prevented from being reflected in the emission area EMA. However, the disclosure is not limited thereto. For example, in an embodiment, at least one first contact hole CH1 may be disposed in the emission area EMA.

In an embodiment, each pixel circuitPXC may be disposed under or below the light emitting elements LD disposed in the corresponding sub-pixel area SPA. For example, each pixel circuit PXC may be formed or disposed in a pixel circuit layer under or below the light emitting elements LD and electrically connected or coupled to the first electrode ELT1 through the first contact hole CH1.

In an embodiment, the second electrode ELT2 may be electrically connected or coupled to a second connection electrode CNL2. For instance, the second electrode ELT2 may be integrally coupled to the second connection electrode CNL2. For example, the second electrode ELT2 may be formed of at least one branch diverging from the second connection electrode CNL2. In the case where the second electrode ELT2 and the second connection electrode CNL2 may be formed integrally with each other, the second connection electrode CNL2 may be regarded as an area of the second electrode ELT2. However, the disclosure is not limited thereto. For example, in an embodiment, the second electrode ELT2 and the second connection electrode CNL2 may be individually formed and electrically connected or coupled to each other through at least one contact hole, via hole, or the like, which is not illustrated.

In an embodiment, the second electrode ELT2 and the second connection electrode CNL2 may extend in different directions in the corresponding sub-pixel area SPA. For example, when the second connection electrode CNL2 extends in the first direction DR1, the second electrode ELT2 may extend in the second direction DR2 intersecting with the first direction DR1.

In an embodiment, the second connection electrode CNL2 may have a single-layer or multi-layer structure. For example, the second connection electrode CNL2 may include a 2_1-th connection electrode CNL2_1 integrally coupled with the second reflective electrode REF2, and a 2_2-th connection electrode CNL2_2 integrally coupled with the second conductive capping layer CPL2. In an embodiment, the second connection electrode CNL2 may have the same cross-sectional structure (stacked structure) as that of the second electrode ELT2, but the disclosure is not limited thereto.

In an embodiment, the second electrode ELT2 and the second connection electrode CNL2 may be electrically connected or coupled to the second power supply VSS. For example, the second electrode ELT2 and the second connection electrode CNL2 may be electrically connected or coupled to the second power supply VSS through a second contact hole CH2, and a power line (not illustrated) electrically connected or coupled thereto. In an embodiment, the second contact hole CH2 may be disposed outside the emission area EMA of each sub-pixel SPX. For example, the second contact hole CH2 may be disposed around the corresponding emission area EMA such that the second contact hole CH2 overlaps with the bank BNK. In this case, the first contact hole CH1 may be covered with or overlapped by the bank BNK, so that a pattern may be prevented from being reflected in the emission area EMA. However, the disclosure is not limited thereto. For example, in an embodiment, at least one second contact hole CH2 may be disposed in the emission area EMA.

In an embodiment, an area of the power line for supplying the second power supply VSS may be disposed in the pixel circuit layer under or below the light emitting elements LD. For example, the power line is disposed under or below the pixel circuit layer under or below the light emitting elements LD and electrically connected or coupled to the second electrode ELT2 through a second contact hole CH2. However, the disclosure is not limited to the foregoing structure, and the position of the power line may be changed in various ways.

In an embodiment, the first partition wall PW1 may be disposed under or below the first electrode ELT1 such that the first partition wall PW1 overlaps with an area of the first electrode ELT1. The second partition wall PW2 may be disposed under or below the second electrode ELT2 such that the second partition wall PW2 overlaps with an area of the second electrode ELT2. The first and second partition walls PW1 and PW2 may be disposed in each emission area EMA at positions spaced apart from each other, and respectively make areas of the first and second electrode ELT1 and ELT2 protrude upward. For example, the first electrode ELT1 may be disposed on the first partition wall PW1 and protrude in a height direction of the first substrate SUB1 by the first partition wall PW1. The second electrode ELT2 may be disposed on the second partition wall PW2 and protrude in the height direction of the first substrate SUB1.

In an embodiment, at least one light emitting element LD, for example, a plurality of light emitting elements LD, may be arranged or disposed between the first and second electrodes ELT1 and ELT2 of each sub-pixel SPX. For example, at least one first light emitting element LD1 may be disposed between the first and second electrodes ELT1 and ELT2 of the first sub-pixel SPX1. At least one second light emitting element LD2 may be disposed between the first and second electrodes ELT1 and ELT2 of the second sub-pixel SPX2. At least one third light emitting element LD3 may be disposed between the first and second electrodes ELT1 and ELT2 of the third sub-pixel SPX3. For example, in each sub-pixel area SPA, a plurality of light emitting elements LD may be electrically connected or coupled in parallel to each other in an area in which the first electrode ELT1 and the second electrode ELT2 are disposed to face each other.

Although in FIG. 6 all of the light emitting elements LD have been illustrated as being arranged or disposed in the first direction DR1, for example, in a transverse direction, the arrangement direction of the light emitting elements LD is not limited thereto. For example, at least one of the light emitting elements LD may be disposed in a diagonal direction.

In an embodiment, the first, second, and third light emitting elements LD1, LD2, and LD3 may emit light of the same color or different colors. For example, all of the first, second, and third light emitting elements LD1, LD2, and LD3 may be formed of blue light emitting diodes, which emit blue light.

The light emitting elements LD are electrically connected or coupled between the first and second electrodes ELT1 and ELT2 of each sub-pixel SPX. For example, the first ends EP1 of the light emitting elements LD may be electrically connected or coupled to the first electrode ELT1 of the corresponding sub-pixel SPX, and the second ends EP2 of the light emitting elements LD may be electrically connected or coupled to the second electrode ELT2 of the corresponding sub-pixel SPX.

In an embodiment, the first ends EP1 of the light emitting elements LD may be electrically connected or coupled to the corresponding first electrode ELT1 through at least one contact electrode, for example, a first contact electrode CNE1, rather than being directly disposed on the first electrode ELT1. However, the disclosure is not limited thereto. For example, in an embodiment, the first ends EP1 of the light emitting elements LD may come into direct electrical contact with the corresponding first pixel electrode ELT1 and may be electrically connected or coupled to the first electrode ELT1.

Similarly, the second ends EP2 of the light emitting elements LD may be electrically connected or coupled to the corresponding second electrode ELT2 through at least one contact electrode, for example, a second contact electrode CNE2, rather than being directly disposed on the second electrode ELT2. However, the disclosure is not limited thereto. For example, in an embodiment, the second ends EP2 of the light emitting elements LD may come into direct electrical contact with the second electrode ELT2 and be electrically connected or coupled to the second electrode ELT2.

In an embodiment, each of the light emitting elements LD may be formed of a light emitting diode which is made of material having an inorganic crystal structure and has a subminiature size, for example, ranging from the nanoscale to the microscale. For example, each of the first, second, and third light emitting elements LD1, LD2, and LD3 may be a subminiature rod-type light emitting diode having a size ranging from the nanoscale to the microscale, which is illustrated in any one of FIGS. 1A, 1B, 2A, 2B, 3A, and 3B.

In an embodiment, the light emitting elements LD may be prepared in a diffused form in a predetermined solution, and then supplied to the emission area EMA of each sub-pixel SPX by an inkjet printing scheme or a slit coating scheme.

For example, the light emitting elements LD may be mixed with a volatile solvent and supplied to each emission area EMA. Here, if a predetermined voltage is supplied through the first and second electrodes ELT1 and ELT2 of each sub-pixel SPX, an electric field is formed between the first and second electrodes ELT1 and ELT2, whereby the light emitting elements LD are self-aligned between the first and second electrodes ELT1 and ELT2.

After the light emitting elements LD have been aligned, the solvent may be removed by a volatilization scheme or other schemes. In this way, the light emitting elements LD may be reliably arranged or disposed between the first and second electrodes ELT1 and ELT2. Furthermore, since the first contact electrode CNE1 and the second contact electrode CNE2 may be respectively formed or disposed on the first ends EP1 and the second ends EP2 of the light emitting elements LD, the light emitting elements LD may be reliably electrically connected or coupled between the first and second electrodes ELT1 and ELT2.

In an embodiment, each first contact electrode CNE1 may be formed or disposed on the first ends EP1 of the light emitting elements LD and at least one area of the first electrode ELT1 corresponding to the first end EP1, whereby the first ends EP1 of the light emitting elements LD may be physically and/or electrically connected or coupled to the first electrode ELT1. Similarly, each second contact electrode CNE2 may be formed or disposed on the second ends EP2 of the light emitting elements LD and at least one area of the second electrode ELT2 corresponding to the second end EP2, whereby the second ends EP2 of the light emitting elements LD may be physically and/or electrically connected or coupled to the second electrode ELT2.

The light emitting elements LD disposed in each sub-pixel area SPA may gather, thus forming a light source of the corresponding sub-pixel SPX. For example, if driving current flows through at least one sub-pixel SPX during each frame period, the light emitting elements LD that may be electrically connected or coupled in the forward direction between the first and second electrodes ELT1 and ELT2 of the sub-pixel SPX may emit light having a luminance corresponding to the driving current.

In an embodiment, each emission area EMA may be enclosed by the bank BNK. For example, the display device in accordance with an embodiment may include the bank BNK disposed between the first, second, and third sub-pixels SPX1, SPX2, SPX3 to enclose the emission area EMA of each of the first, second, and third sub-pixels SPX1, SPX2, and SPX3.

In an embodiment, the bank BNK may be a color bank CBNK including at least one color bank layer. According to the foregoing embodiment, residues of the bank BNK may be prevented from remaining in the emission area EMA, and the bank BNK may be easily formed in a desired shape. Detailed description related to the bank BNK will be made below.

Figure 7A:
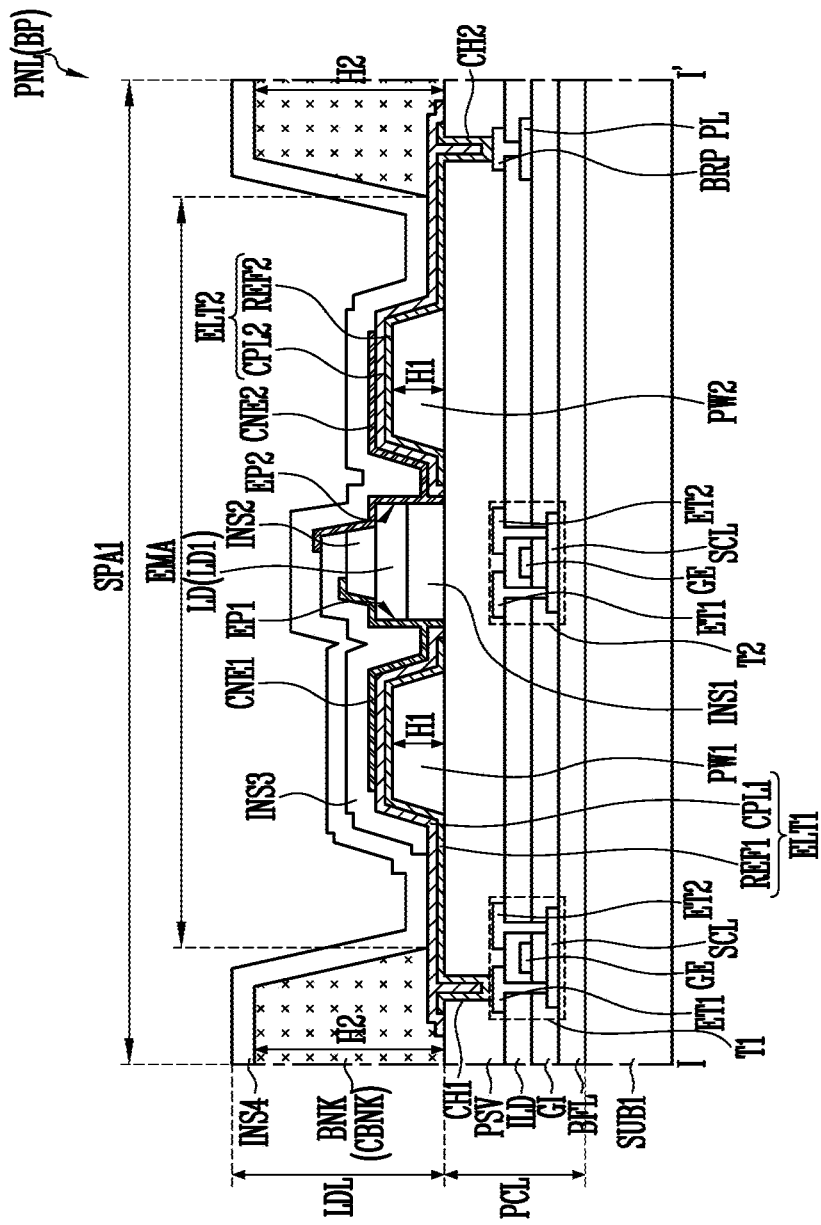
FIGS. 7A and 7B are sectional diagrams each illustrating the structure of a sub-pixel in accordance with an embodiment, and, for example, illustrate embodiments of a cross-section corresponding to line I-I' of FIG. 6.
Figure 7B:
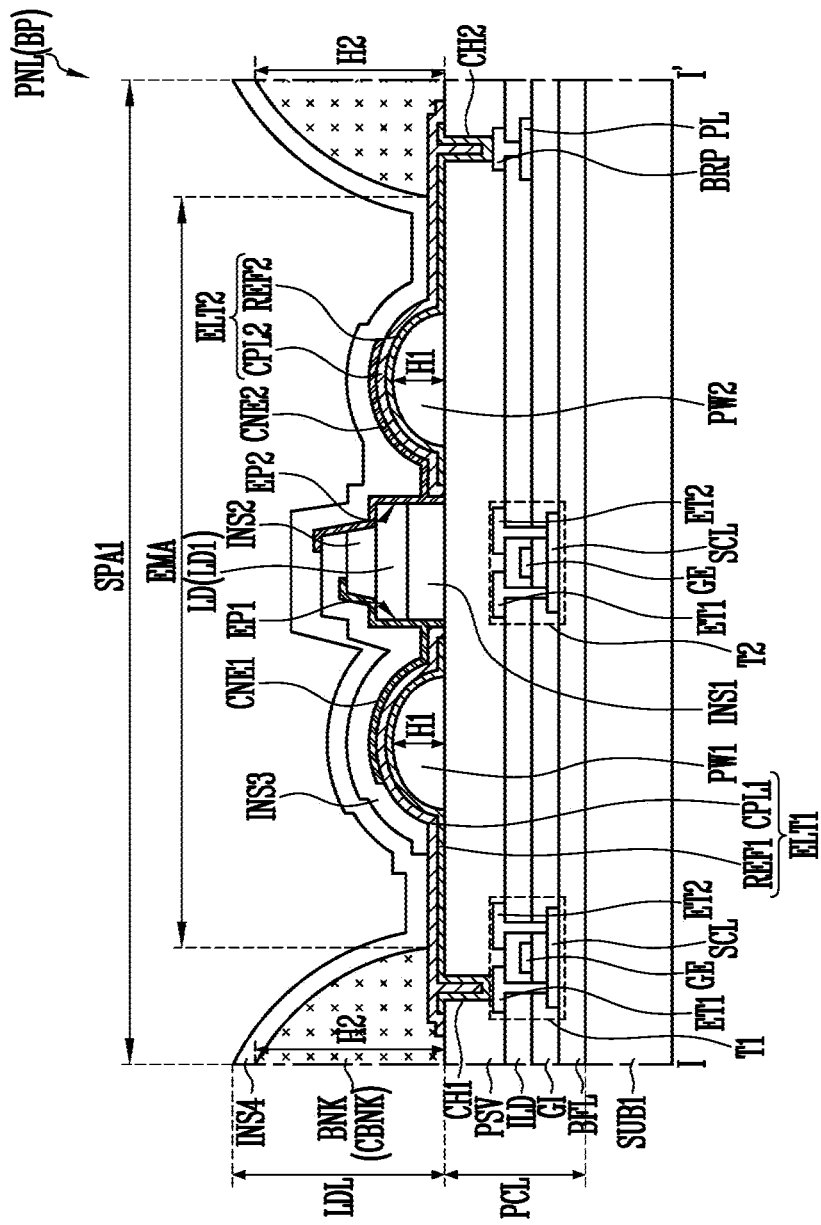

FIGS. 7A and 7B are sectional diagrams each illustrating the structure of a sub-pixel SPX in accordance with an embodiment, and, for example, illustrate embodiments of a cross-section corresponding to line I-I' of FIG. 6. In detail, FIGS. 7A and 7B illustrate different embodiments pertaining to the shapes of the first and second partition walls PW1 and PW2 and the bank BNK.

In an embodiment, FIGS. 7A and 7B illustrate any one sub-pixel area SPA formed or disposed in a bottom panel BP of the display panel PNL. In an embodiment, the cross-sectional structures of the first, second, and third sub-pixels SPX1, SPX2, and SPX3 described above may be substantially identical or similar to each other. Therefore, for the convenience sake, with reference to FIGS. 7A and 7B illustrating the cross-section of the first sub-pixel area SPA1 corresponding to line I-I' of FIG. 6, the structure of each sub-pixel SPX will be comprehensively described.

Referring to FIGS. 7A and 7B along with FIGS. 1A to 6, a pixel circuit layer PCL and a display element layer LDL are successively disposed in each sub-pixel area SPA on the first substrate SUB1. In an embodiment, the pixel circuit layer PCL and the display element layer LDL may be formed or disposed on the entirety of the display area DA of the display panel PNL.

In an embodiment, the pixel circuit layer PCL may include circuit elements which constitute the pixel circuits PXC of the sub-pixels SPX. The display element layer LDL may include light emitting elements LD of the sub-pixels SPX.

For example, in the first sub-pixel area SPA1 on the first substrate SUB1, the pixel circuit layer PCL including circuit elements constituting the pixel circuit PXC of the corresponding first sub-pixel SPX1, and the display element layer LDL including at least one light emitting element LD, for example, a plurality of first light emitting elements LD1, provided in the first sub-pixel SPX1 may be successively disposed on one surface of the first substrate SUB1. Similarly, in the second sub-pixel area SPA2 on the first substrate SUB1, the pixel circuit layer PCL including circuit elements constituting the pixel circuit PXC of the corresponding second sub-pixel SPX2, and the display element layer LDL including a plurality of first light emitting elements LD1 provided in the second sub-pixel SPX2 may be successively disposed on the one surface of the first substrate SUB1. In the third sub-pixel area SPA3 on the first substrate SUB1, the pixel circuit layer PCL including circuit elements constituting the pixel circuit PXC of the corresponding third sub-pixel SPX3, and the display element layer LDL including a plurality of third light emitting elements LD3 provided in the third sub-pixel SPX3 may be successively disposed on the one surface of the first substrate SUB1.

In this way, the pixel circuit layer PCL and the display element layer LDL may be successively disposed in the display area DA on the first substrate SUB1. For example, the pixel circuit layer PCL may be formed or disposed on a surface of the first substrate SUB1, and the display element layer LDL may be formed or disposed over the surface of the first substrate SUB1 on which the pixel circuit layer PCL may be formed or disposed.

In an embodiment, the pixel circuit layer PCL may include a plurality of circuit elements disposed in the display area DA. For example, the pixel circuit layer PCL may include a plurality of circuit elements which may be formed or disposed in each of the sub-pixel area SPA to form the pixel circuit PXC of the corresponding sub-pixel SPX. For example, the pixel circuit layer PCL may include a plurality of transistors disposed in each sub-pixel area SPA, for example, the first and second transistors T1 and T2 of FIGS. 5A and 5B. Although not illustrated in FIGS. 7A and 7B, the pixel circuit layer PCL may include a storage capacitor Cst disposed in each sub-pixel area SPA, various signal lines (for example, the scan line Si and the data line Dj illustrated in FIGS. 5A and 5B) electrically connected or coupled to each pixel circuit PXC, and various power lines (for example, a first power line (not illustrated) and a second power line PL to respectively transmit the first power VDD and the second power VSS) electrically connected or coupled to the pixel circuit PXC and/or the light emitting elements LD.

In an embodiment, a plurality of transistors, for example, first and second transistors T1 and T2, provided in each pixel circuit PXC may have substantially an identical or similar cross-sectional structure. However, the disclosure is not limited thereto. In an embodiment, at least some or a predetermined number of the plurality of transistors may have different types and/or structures.

For example, the pixel circuit layer PCL may include a plurality of insulating layers. For example, the pixel circuit layer PCL may include a buffer layer BFL, a gate insulating layer GI, an interlayer insulating layer ILD, and a passivation layer PSV which are successively stacked on one surface of the first substrate SUB1.

In an embodiment, the buffer layer BFL may prevent impurities from diffusing into each circuit element. The buffer layer BFL may be formed of a single layer, or may be formed of multiple layers having at least two or more layers. In the case where the buffer layer BFL has a multilayer structure, the respective layers may be formed of the same or similar material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIGS. 7A and 7B illustrates an embodiment in which each of the first and second transistors T1 and T2 may include the first transistor electrode ET1 and the second transistor electrode ET2 that are formed separately from the semiconductor layer SCL, the disclosure is not limited thereto. For example, in an embodiment, the first and/or second electrode ET1 and/or ET2 provided in at least one transistor disposed in each sub-pixel area SPA may be integrally formed with the corresponding semiconductor layer SCL.

The semiconductor layer SCL may be disposed on the buffer layer BFL. For example, the semiconductor layer SCL may be disposed between the gate insulating layer GI and the first substrate SUB1 on which the buffer layer BFL may be formed or disposed. The semiconductor layer SCL may include a first area which may come into electrical contact with the first transistor electrode ET1, a second area which may come into electrical contact with the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, for example. The channel region of the semiconductor layer SCL may be an intrinsic semiconductor, which may be an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least a portion of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected or coupled to the semiconductor layer SCL. For example, the first and second transistor electrodes ET1 and ET2 may be respectively electrically connected or coupled to the first area and the second area of the semiconductor layer SCL through corresponding contact holes which may pass through the gate insulating layer GI and the interlayer insulating layer ILD.

In an embodiment, any one of the first and second transistor electrodes ET1 and ET2 of at least one transistor (for example, the first transistor T1 of FIGS. 5A and 5B) provided on the pixel circuit PXC may be electrically connected or coupled, through the first contact hole CH1 passing through the passivation layer PSV, to the first electrode ELT1 of the light emitting unit EMU disposed on the passivation layer PSV.

In an embodiment, at least one signal line and/or power line that may be electrically connected or coupled to each sub-pixel SPX may be disposed on a layer identical with that of one electrode of each of the circuit elements that may form the pixel circuit PXC. For example, the power line PL for supplying the second power supply VSS may be disposed on a layer identical with that of the gate electrodes GE of the first and second transistors T1 and T2, and electrically connected or coupled to the second electrode ELT2 of the light emitting unit EMU that may be disposed on the passivation layer PSV, both through a bridge pattern BRP disposed on the same layer as that of the first and second transistor electrodes ET1 and ET2 and through at least one second contact hole CH2 passing through the passivation layer PSV. However, the structures and/or positions of the power line PL, for example may be changed in various ways.

In an embodiment, the display element layer LDL may include a plurality of light emitting elements LD disposed over the pixel circuit layer PCL in each sub-pixel area SPA. For example, the display element layer LDL may include the first light emitting elements LD1 disposed in each first sub-pixel area SPA1, the second light emitting elements LD2 disposed in each second sub-pixel area SPA2, and the third light emitting elements LD3 disposed in each third sub-pixel area SPA3. Furthermore, the display element layer LDL may further include at least one insulating layer and/or insulating pattern disposed around the light emitting elements LD.

For example, the display element layer LDL may include the first and second electrodes ELT1 and ELT2 disposed in each sub-pixel area SPA, the light emitting elements LD disposed between the first and second electrodes ELT1 and ELT2 corresponding to each other, and the first and second contact electrodes CNE1 and CNE2 respectively disposed on first and second ends EP1 and EP2 of the light emitting elements LD. For example, the display element layer LDL may further include, for example, at least one conductive layer and/or at least one insulating layer (or insulating pattern). For example, the display element layer LDL may further include at least one of the first and second partition walls PW1 and PW2, the bank BNK, and the first to fourth insulating layers INS1, INS2, INS3, and INS4.

In an embodiment, the first and second partition walls PW1 and PW2 may be disposed on the pixel circuit layer PCL. For example, the first and second partition walls PW1 and PW2 may be disposed on the emission area EMA of each sub-pixel area SPA at positions spaced apart from each other by a predetermined distance.

In an embodiment, each of the first and second partition walls PW1 and PW2 may include insulating material having inorganic material or organic material. Furthermore, each of the first and second partition walls PW1 and PW2 may have a single-layer structure or a multi-layer structure. In other words, the material and/or the stacked structure of each of the first and second partition walls PW1 and PW2 may be changed in various ways rather than being particularly limited.

In an embodiment, each of the first and second partition walls PW1 and PW2 may have various shapes. For example, as illustrated in FIG. 7A, each of the first and second partition walls PW1 and PW2 may have a cross-sectional shape substantially of a trapezoid that may be reduced in width from the bottom to the top thereof. In this case, each of the first and second partition walls PW1 and PW2 may have an inclined surface on at least one or a side. Alternatively, as illustrated in FIG. 7B, each of the first and second partition walls PW1 and PW2 may have a substantially semi-circular or semi-elliptical cross-section the width of which may be gradually reduced upward. In this case, each of the first and second partition walls PW1 and PW2 may have a curved surface on at least one or a side. In other words, the shape of each of the first and second partition walls PW1 and PW2 may be changed in various ways rather than being particularly limited.

In an embodiment, the first and second electrodes ELT1 and ELT2 and the first and second connection electrodes CNL1 and CNL2 may be disposed in each sub-pixel area SPA provided with the first and second partition walls PW1 and PW2.

In an embodiment, the first and second electrodes ELT1 and ELT2 may be disposed at positions spaced apart from each other by a predetermined distance on the first substrate SUB1 on which the pixel circuit layer PCL and/or the first and second partition walls PW1 and PW2 may be formed or disposed. The first and second connection electrodes CNL1 and CNL2 may be respectively integrally coupled with the first and second electrodes ELT1 and ELT2.

In an embodiment, the first electrodes ELT1 may be disposed on the respective first partition walls PW1, and the second electrodes ELT2 may be disposed on the respective second partition wall PW2. In an embodiment, any one of the first and second electrodes ELT1 and ELT2 may be an anode electrode, and the other may be a cathode electrode.

The first and second electrodes ELT1 and ELT2 may respectively have shapes corresponding to those of the first and second partition walls PW1 and PW2. For example, each first electrode ELT1 may protrude in a height direction of the first substrate SUB1 by the corresponding first partition wall PW1 and have an inclined or curved surface corresponding to the cross-section of the first partition wall PW1. For example, each first electrode ELT1 may include a first reflective electrode REF1 which protrudes in the height direction of the first substrate SUB1 by the first partition wall PW1 provided under or below the first reflective electrode REF1 and has an inclined or curved surface facing the first end EP1 of an adjacent light emitting element LD, and a first conductive capping layer CPL1 selectively disposed on the first reflective electrode REF1.

Similarly, each second electrode ELT2 may protrude in the height direction of the first substrate SUB1 by the corresponding second partition wall PW2 and have an inclined or curved surface corresponding to the cross-section of the second partition wall PW2. For example, each second electrode ELT2 may include a second reflective electrode REF2 which protrudes in the height direction of the first substrate SUB1 by the second partition wall PW2 provided under or below the second reflective electrode REF2 and has an inclined or curved surface facing the second end EP1 of an adjacent light emitting element LD, and a second conductive capping layer CPL2 selectively disposed on the second reflective electrode REF2.

In an embodiment, the first and second partition walls PW1 and PW2 may have the same height, so that the first and second electrodes ELT1 and ELT2 may have the same height. As such, if the first and second electrodes ELT1 and ELT2 have the same height, the light emitting elements LD may be more reliably electrically connected or coupled between the first and second electrodes ELT1 and ELT2. However, the disclosure is not limited to this. For example, the shapes, the structures, and/or the mutual disposition relationship of the first and second electrodes ELT1 and ELT2 may be changed in various ways.

In an embodiment, each of the first and second reflective electrodes REF1 and REF2 may include at least one conductive material. For example, each of the first and second reflective electrodes REF1 and REF2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT; however, it is not limited thereto. Furthermore, the first and second reflective electrodes REF1 and REF2 may have identical or different single-layer or multi-layer structures.

For example, each of the first and second reflective electrodes REF1 and REF2 may include at least one reflective conductive layer formed of conductive material having a predetermined reflectivity. Furthermore, in an embodiment, each of the first and second reflective electrodes REF1 and REF2 may further include at least one transparent conductive layer disposed over and/or under or below the reflective conductive layer.

In an embodiment, the reflective conductive layer may include at least one of metals such as Ag, Mg, Al, Pt, Pd, Au, Ni, Nd, Ir, Cr, and an alloy thereof, however, the disclosure is not limited thereto. In other words, the material of the reflective conductive layer that may form the first and second reflective electrodes REF1 and REF2 is not particularly limited.

In an embodiment, the transparent conductive layer may be formed of various transparent electrode material. For example, each transparent electrode layer may include ITO, IZO or ITZO, but the disclosure is not limited thereto. In other words, the material of the transparent conductive layer that may be provided in the first and second reflective electrodes REF1 and REF2 is not particularly limited.

In an embodiment, each of the first and second reflective electrodes REF1 and REF2 may have a three-layer structure having a stacked structure of ITO/Ag/ITO. Furthermore, each of 1_1-th and 2_1-th connection electrodes CNL1_1 and CNL2_1 electrically connected or coupled to the first and second reflective electrodes REF1 and REF2 may also have a multi-layer structure in the same manner as that of the first and second reflective electrodes REF1 and REF2. As such, if each of the first and second reflective electrodes REF1 and REF2 and/or each of the 1_1-th and 2_1-th connection electrodes CNL1_1 and CNL2_1 has a multi-layer structure with at least two or more layers, a voltage drop due to a signal delay may be minimized.

The first and second reflective electrodes REF1 and REF2 may enable light emitted from the opposite ends of each of the light emitting elements LD, for example, the first and second ends EP1 and EP2 of the light emitting elements LD, to travel in a direction (for example, in a frontal direction of the display panel PNL) in which an image is displayed. By way of example, if the first and second reflective electrodes REF1 and REF2 respectively have inclined surfaces or curved surfaces corresponding to the shapes of the first and second partition walls PW1 and PW2, light emitted from the first and second ends EP1 and EP2 of each of the light emitting elements LD may be reflected by the first and second reflective electrodes REF1 and REF2, whereby the light may travel more reliably in the frontal direction of the display panel PNL (for example, in an upward direction of the first substrate SUB1). Thereby, the efficiency of light emitted from the light emitting elements LD may be enhanced.

In an embodiment, each of the first and second partition walls PW1 and PW2 may also function as a reflective component. For example, the first and second partition walls PW1 and PW2, along with the first and second reflective electrodes REF1 and REF2 provided on the first and second partition walls PW1 and PW2, may function as reflective components for enhancing the efficiency of light emitted from each of the light emitting elements LD. The first and second conductive capping layers CPL1 and CPL2 may be selectively disposed over the first and second reflective electrodes REF1 and REF2. For example, the first conductive capping layer CPL1 may be disposed over the first reflective electrode REF1 to cover or overlap the first reflective electrode REF1. The second conductive capping layer CPL2 may be provided over the second reflective electrode REF2 to cover or overlap the second reflective electrode REF2.

Each of the first and second conductive capping layers CPL1 and CPL2 may be formed of transparent conductive material such as ITO or IZO so as to minimize loss of light emitted from the light emitting elements LD. However, the disclosure is not limited thereto. For example, the material of the first and second conductive capping layers CPL1 and CPL2 may be changed in various ways.

The first and second conductive capping layer CPL1 and CPL2 may prevent the first and second reflective electrodes REF1 and REF2 from being damaged due to a failure or the like which may occur during a process of manufacturing the display panel PNL. Furthermore, the first and second conductive capping layers CPL1 and CPL2 may enhance adhesive force between the first substrate SUB1 provided with the pixel circuit layer PCL, for example and the first and second reflective electrodes REF1 and REF2. In an embodiment, at least one of the first and second conductive capping layers CPL1 and CPL2 may be omitted.

In an embodiment, a first insulating layer INS1 may be disposed in each sub-pixel area SPA in which the first and second electrodes ELT1 and EL2 are disposed. In an embodiment, the first insulating layer INS1 may be disposed between the pixel circuit layer PCL and the light emitting elements LD. The first insulating layer INS1 may function stably support the light emitting elements LD and prevent the light emitting elements LD from being displaced from correct positions thereof. In an embodiment, the first insulating layer INS1 may be formed in an independent pattern on one or an area of the emission area EMA; however, the disclosure is not limited thereto.

In an embodiment, at least one light emitting element LD, for example, a plurality of light emitting elements LD, may be provided and aligned on each sub-pixel area SPA in which the first insulating pattern INS1 is disposed. For example, a plurality of first light emitting elements LD1 may be provided and aligned in the emission area EMA of the first sub-pixel area SPA1.

In an embodiment, the light emitting elements LD may be self-aligned by an electric field formed between the first and second electrodes ELT1 and ELT2 when predetermined voltages are applied to the first and second electrodes ELT1 and ELT2. Hence, the light emitting elements LD may be disposed between the first and second electrodes ELT1 and ELT2 of the corresponding sub-pixel area SPA.

The shape and/or the structure of each of the light emitting elements LD is not limited to embodiments shown in FIGS. 7A and 7B. For example, each light emitting element LD may have various shapes, cross-sectional structures and/or connection structures.

In an embodiment, a second insulating layer INS2 covering or overlapping portions of respective upper surfaces of the light emitting elements LD may be disposed on each sub-pixel area SPA in which the light emitting elements LD are disposed. In an embodiment, the second insulating layer INS2 may be selectively disposed on only upper portions of the light emitting elements LD without covering or overlapping at least the opposite ends of the light emitting elements LD, for example, the first and second ends EP1 and EP2. The second insulating layer INS2 may be formed in an independent pattern on one or an area of the emission area EMA; however, the disclosure is not limited thereto.

In an embodiment, the first contact electrode CNE1 may be disposed in each sub-pixel area SPA in which the second insulating layer INS2 is disposed. In an embodiment, the first contact electrode CNE1 may be disposed on the first electrode ELT1 disposed in the corresponding sub-pixel area SPA such that the first contact electrode CNE1 comes into contact with one area of the first electrode ELT1. Furthermore, the first contact electrode CNE1 may be disposed on the first end EP1 of at least one light emitting element LD disposed in the corresponding sub-pixel area SPA such that that the first contact electrode CNE1 comes into contact with the first end EP1. Due to the first contact electrode CNE1, the first end EP1 of at least one light emitting element LD disposed in each sub-pixel area SPA may be electrically connected or coupled to the first electrode ELT1 disposed in the corresponding sub-pixel area SPA.

In an embodiment, a third insulating layer INS3 may be disposed in each sub-pixel area SPA in which the first contact electrode CNE1 is disposed. In an embodiment, the third insulating layer INS3 may be formed or disposed to cover or overlap the second insulating layer INS2 and the first contact electrode CNE1 that may be disposed in the corresponding sub-pixel area SPA.

In an embodiment, the second contact electrode CNE2 may be disposed in each sub-pixel area SPA in which the third insulating layer INS3 is disposed. In an embodiment, the second contact electrode CNE2 may be disposed on the second electrode ELT2 disposed in the corresponding sub-pixel area SPA such that the second contact electrode CNE2 may come into electrical contact with one area of the second electrode ELT2. Furthermore, the second contact electrode CNE2 may be disposed on the second end EP2 of at least one light emitting element LD disposed in the corresponding sub-pixel area SPA such that that the second contact electrode CNE2 may come into electrical contact with the second end EP2. Due to the second contact electrode CNE2, the second end EP2 of at least one light emitting element LD disposed in each sub-pixel area SPA may be electrically connected or coupled to the second electrode ELT2 disposed in the corresponding sub-pixel area SPA.

The bank BNK may be disposed on the first substrate SUB1 on which the first and second electrodes ELT1 and ELT2 may be formed or disposed. For example, the bank BNK may be formed or disposed between the sub-pixels SPX to enclose the respective emission areas EMA of the sub-pixels SPX, so that a pixel defining layer for defining the emission area EMA of each sub-pixel SPX may be formed or disposed.

In an embodiment, the bank BNK may be formed to have a height H2 greater than a height H1 of each of the first and second partition walls PW1 and PW2. At the step of supplying the light emitting elements LD to each emission area EMA, the bank BNK may function as a dam structure that may prevent a solution mixed with the light emitting elements LD from being drawn into the emission area EMA of an adjacent sub-pixel SPX or control the amount of solution such that a constant amount of solution is supplied to each emission area EMA.

In an embodiment, the bank BNK may have various shapes. In an embodiment, the bank BNK may have a trapezoidal cross-section which is reduced in width upward, as illustrated in FIG. 7A. For example, the bank BNK may have, in an area bordering on the emission area EMA of each sub-pixel SPX, an inclined surface which is reduced in width upward. In an embodiment, the bank BNK may have, in an area bordering on the emission area EMA of each sub-pixel SPX, a curved surface which is reduced in width upward, as illustrated in FIG. 7B. In other wards, in an embodiment, the bank BNK may have a shape which is reduced in width upward, and the shape thereof may be changed in various ways.

Furthermore, the bank BNK may be formed to prevent light emitted from each emission area EMA from entering an adjacent emission area EMA and occurring optical interference. To this end, the bank BNK may be formed to prevent light emitted from the light emitting elements LD of each sub-pixel SPX from passing through the bank BNK.

For example, the bank BNK may be formed of a color bank CBNK including color filter material for blocking light of colors and/or wavelengths emitted from the first, second, and third light emitting elements LD1, LD2, and LD3. In an embodiment, the color bank CBNK may include a color pigment (or a color dye) having a color different from the color of light emitted from the first, second, and third light emitting elements LD1, LD2, and LD3. For example, the bank BNK may be formed of at least one color bank layer including color filter material for blocking light of colors and/or wavelengths emitted from the first, second, and third light emitting elements LD1, LD2, and LD3. Therefore, the bank BNK may function as a light shielding layer that may prevent light emitted from the first, second, and third light emitting elements LD1, LD2, and LD3 from leaking into an adjacent emission area EMA.

In an embodiment, the first, second, and third light emitting elements LD1, LD2, and LD3 may emit light of the same color. For example, all of the first, second, and third light emitting elements LD1, LD2, and LD3 may be formed of blue (B) light emitting elements that may emit blue light. In this case, the bank BNK may include color filter material that may block light having a blue wavelength band and allow light having a wavelength band different from the blue wavelength band, for example, light having a predetermined color and a wavelength bank different from the blue light, to selectively pass through the bank BNK.

For example, the bank BNK may include red-based color filter material for allowing light having a wavelength band relatively far from the blue wavelength band in a visible ray area, for example, red light, to selectively pass therethrough. However, the material of the bank BNK is not limited to the foregoing material. For example, in an embodiment, all of the first, second, and third light emitting elements LD1, LD2, and LD3 may emit blue light, and the bank BNK may include yellow-based color filter material. Alternatively, in an embodiment, the bank BNK may include at least two colors of color filter materials. For example, the bank BNK may be formed of an orange color bank CBNK including a combination of red color pigment and yellow color pigment.

In this way, if the bank BNK is formed to include the color filter material for blocking light of color emitted from the light emitting elements LD of each sub-pixel SPX, the bank BNK may be formed without using black matrix material such as carbon black and also effectively prevent light from leaking between adjacent sub-pixels SPX. In an embodiment, residues of the bank BNK which may be caused in display devices of comparative examples using the black matrix material may be prevented from occurring. Furthermore, since the bank BNK is formed using the color filter material that may facilitate a patterning process compared to that of the black matrix material, the bank BNK may be more easily formed in a desired shape and/or at a desired height (for example, a height of about 2.5 m or more).

In an embodiment, a fourth insulating layer INS4 may be disposed on the first substrate SUB1 on which the first and second electrodes ELT1 and ELT2, the light emitting diodes LD, the first and second contact electrodes CNE1 and CNE2, the bank BNK, for example are disposed. For example, the fourth insulating layer INS4 may be formed or disposed on the entirety of the display area DA to cover or overlap the upper surface of the first substrate SUB1 on which the first and second electrodes ELT1 and ELT2, the light emitting diodes LD, and the first and second contact electrodes CNE1 and CNE2 may be disposed. In an embodiment, the fourth insulating layer INS4 may not only include at least one inorganic layer and/or organic layer for protecting components of the display element layer LDL, but may also include various functional layers, for example.

Figure 8:
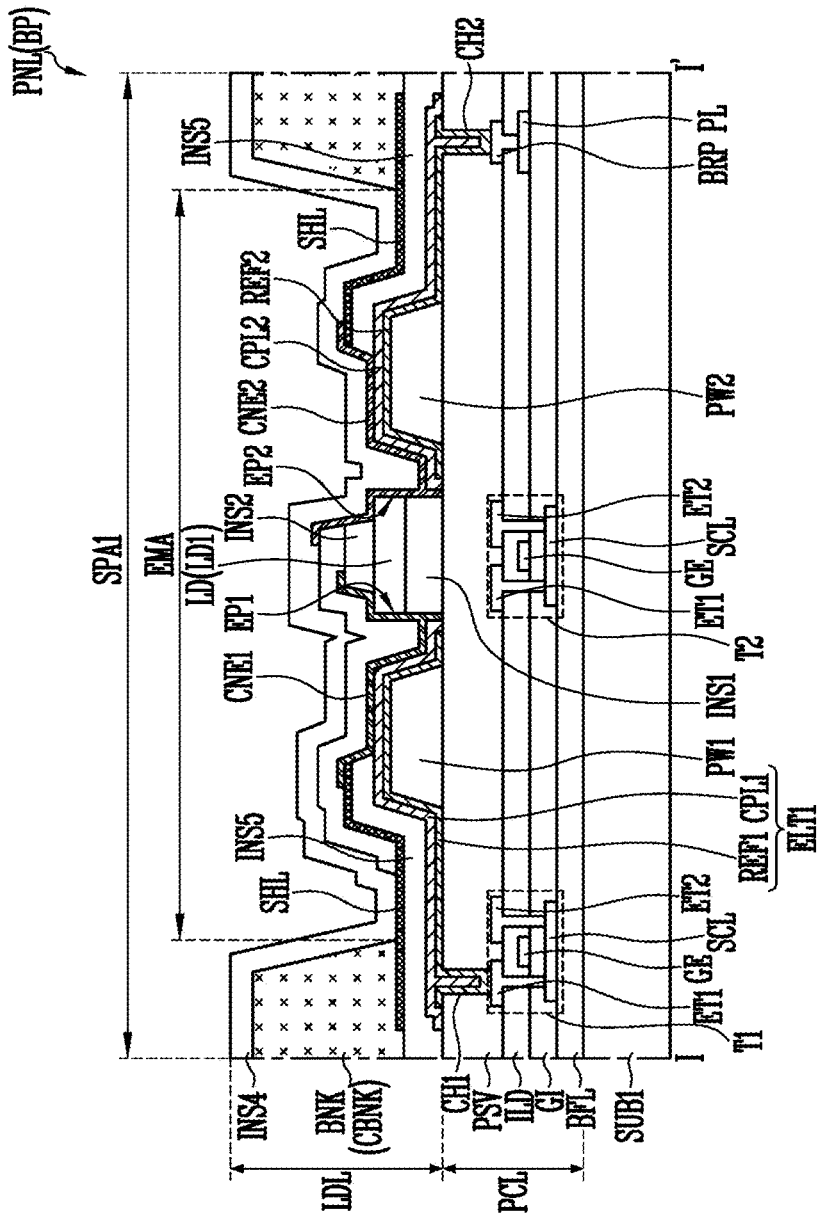
FIG. 8 is a sectional diagram illustrating the structure of a sub-pixel in accordance with an embodiment and, for example, illustrates an embodiment of a cross-section corresponding to line I-I' of FIG. 6.

FIG. 8 is a sectional diagram illustrating the structure of a sub-pixel SPX in accordance with an embodiment and, for example, illustrates an embodiment of a cross-section corresponding to line I-I' of FIG. 6. In detail, FIG. 8 illustrates a modified embodiment of the sub-pixel SPX illustrated in FIGS. 6 to 7B. In the description of an embodiment of FIG. 8, like reference numerals are used to designate components similar or equal to those of the above-described embodiments, for example, embodiments of FIGS. 6 to 7B, and detailed explanation thereof may be omitted.

Referring to FIG. 8, the sub-pixel SPX in accordance with an embodiment may further include a shield layer SHL disposed on a border of the emission area EMA to overlap with the bank BNK, and a fifth insulating layer INS5 interposed between the shield layer SHL and the first and second electrodes ELT1 and ELT2. For example, in a plan view, the shield layer SHL may be disposed in a peripheral area of the emission area EMA in a shape enclosing the emission area EMA, and thus may overlap with the bank BNK. Furthermore, the shield layer SHL may be formed or disposed in an area adjacent to the periphery of the emission area EMA to cover or overlap upper portions of the first and second electrodes ELT1 and ELT2.

In an embodiment, the shield layer SHL may be a conductive pattern including at least one conductive material. For example, the shield layer SHL may be formed of at least one transparent conductive layer including transparent conductive material such as IZO, but the disclosure is not limited thereto. In other words, the shield layer SHL may be formed of various conductive materials, and the composition material thereof is not particularly limited.

Since the shield layer SHL is provided, the light emitting elements LD may be appropriately aligned in the emission area EMA. In detail, the shield layer SHL may offset an electric field generated between adjacent sub-pixels SPX. Hence, the light emitting elements LD may be prevented from being aligned in the perimeter of the sub-pixel SPX, and the light emitting elements LD may be guided to be appropriately aligned in the emission area EMA of each sub-pixel SPX.

In an embodiment, the shield layer SHL may float to be electrically isolated, but the disclosure is not limited thereto. For example, in an embodiment, the shield layer SHL may be electrically connected or coupled to a predetermined reference power supply.

In an embodiment, the bank BNK may be formed or disposed on one or a surface of the first substrate SUB1 on which the shield layer SHL, for example may be formed or disposed. For example, the bank BNK may be directly formed or disposed on the shield layer SHL.

In the above-mentioned embodiment, the bank BNK may be formed of a color bank CBNK including color filter material. As such, in a case that the bank BNK may be formed of a color bank CBNK, even if the bank BNK may be directly formed or disposed on the shield layer SHL, residues of the bank BNK may be effectively prevented from occurring on the shield layer SHL and/or in the emission area EMA. On the other hand, in the case of a comparative example where the black bank made of black matrix material such as carbon black may be formed or disposed on the shield layer SHL, residues may excessively occur.

Figure 9A:
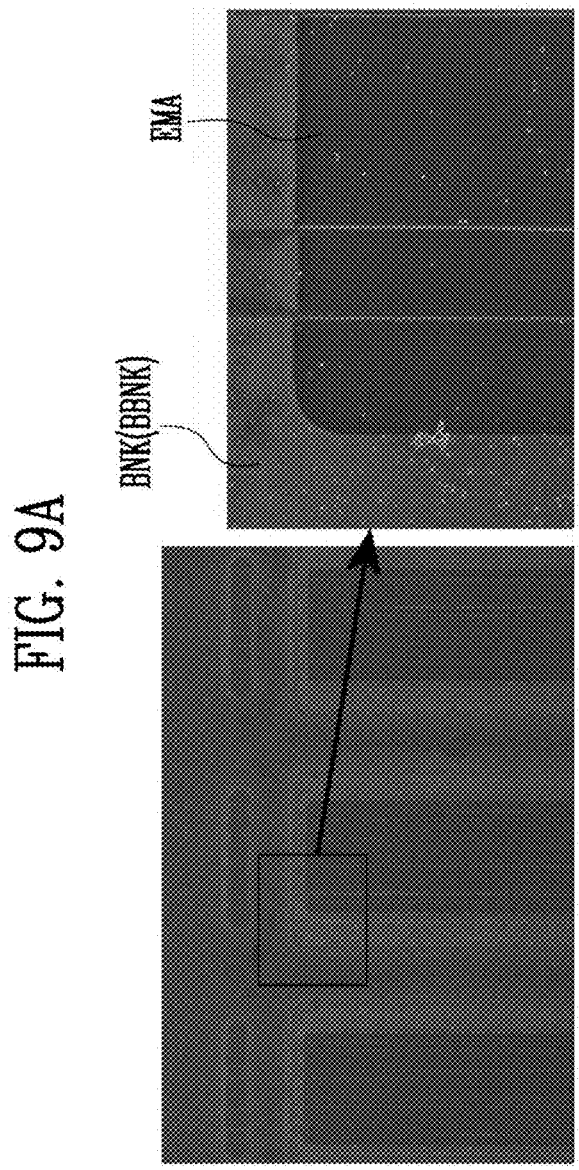
Figure 9C:
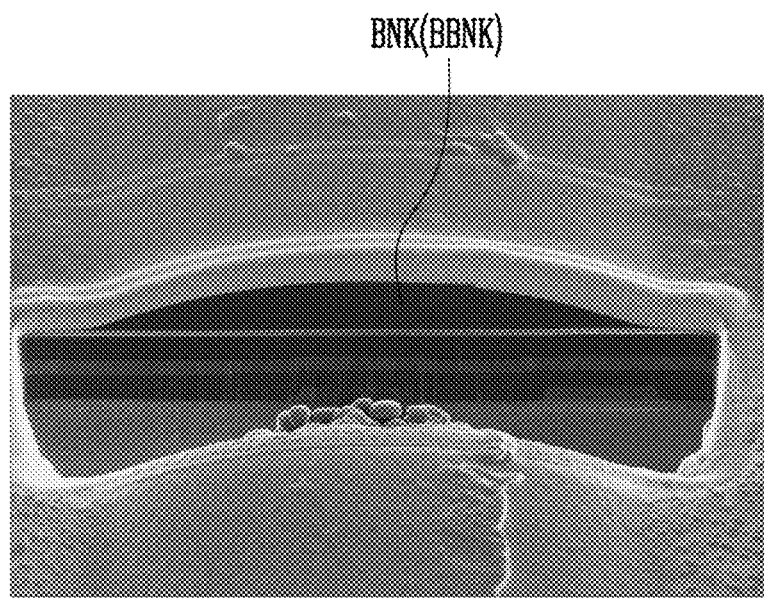
Figure 9D:
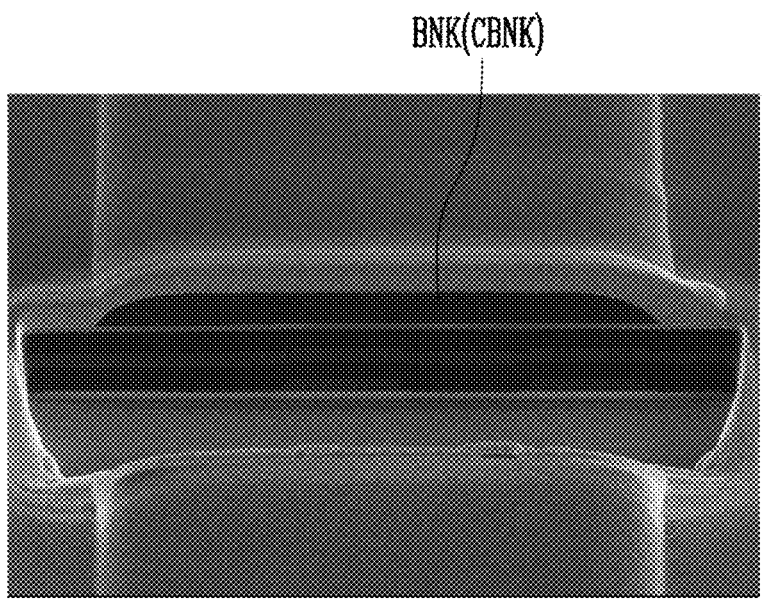

FIGS. 9A to 9D illustrate electron microscope images of a display device of a comparative example including a black bank BBNK and a display device including a color bank CBNK in accordance with an embodiment. In detail, FIGS. 9A and 9B respectively illustrate plan images of areas of display devices in accordance with a comparative example and an embodiment. FIGS. 9C and 9D respectively illustrate sectional images of plan images of areas of display devices in accordance with a comparative example and an embodiment.

Referring to FIGS. 9A and 9B along with FIGS. 6 to 8, it may be seen that in the display device of the comparative example that may include the black bank BBNK formed of black matrix material such as carbon block, a large amount of residues of the bank BNK occur in each emission area EMA. Such residues may cause a short circuit defect in each sub-pixel SPX or induce a black spot defect, thus deteriorating the image quality. On the other hand, it may be checked that in the display device in accordance with an embodiment that may include the color bank CBNK formed of red color filter material, the bank BNK may be clearly formed without residues.

Referring to FIGS. 9C and 9D along with FIGS. 6 to 8, it may be seen that, compared to the black bank BBNK of the comparative example, the color bank CBNK according to the disclosure using the red color filter material may have a taper having an improved angle, and have a superior profile.

In other words, if the color bank CBNK is formed as illustrated in an embodiment, residues of the bank BNK may be prevented from occurring, and the bank BNK may be easily formed in a desired shape.

Figure 10:
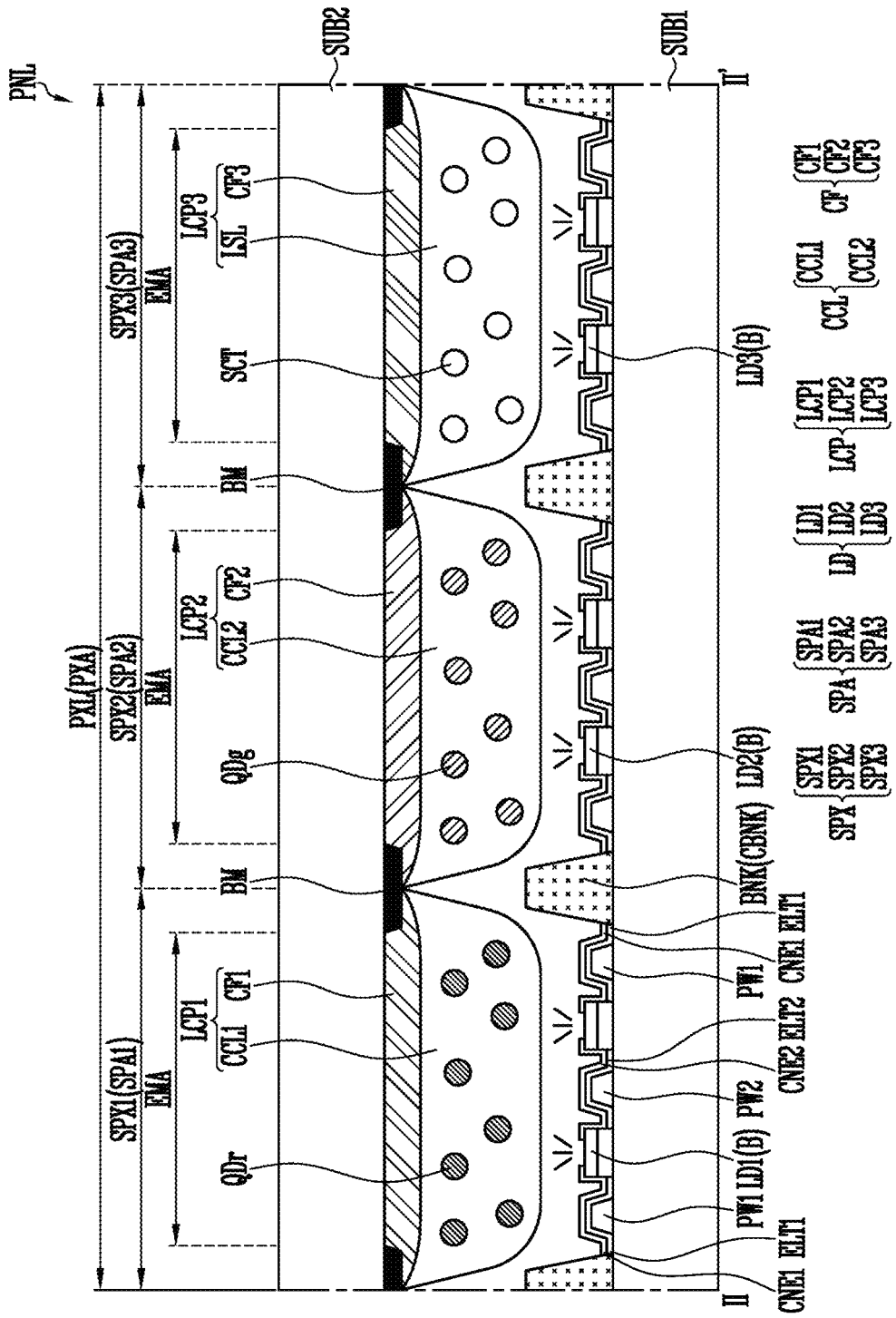
FIG. 10 is a sectional diagram illustrating the structure of a display device in accordance with an embodiment and, for example, illustrates an embodiment of a cross-section corresponding to line II-II' of FIG. 6.

FIG. 10 is a sectional diagram illustrating the structure of a display device in accordance with an embodiment and, for example, illustrates an embodiment of a cross-section corresponding to line II-II' of FIG. 6. In an embodiment of FIG. 10, there is illustrated any one pixel area PXA in which each pixel PXL is disposed, in a display panel PNL formed by bonding a top panel (or an upper panel) and the bottom panel BP to each other. For the convenience sake, FIG. 10 schematically illustrates the structure of the bottom panel BP described in detail in FIGS. 7A to 8, based on some components thereof, and detailed description thereof may be omitted.

Referring to FIG. 10, a display device in accordance with an embodiment may include a second substrate SUB2 located or disposed on one or a surface of the first substrate SUB1 on which first, second, and third sub-pixels SPX1, SPX2, and SPX3 may be disposed, and a light conversion pattern layer LCP disposed on one or a surface of the second substrate SUB2 to face each of the first, second, and third sub-pixels SPX1, SPX2, and SPX3.

In an embodiment, the second substrate SUB2 may be disposed over the first substrate SUB1 to cover or overlap a display area DA on which at least pixels PXL may be disposed. The second substrate SUB2 may form an upper substrate (for example, an encapsulation substrate or a thin-film encapsulation layer) of the display panel PNL and/or a window component.

In an embodiment, the second substrate SUB2 may be a rigid substrate or a flexible substrate, and the material or properties thereof are not particularly limited. Furthermore, the second substrate SUB2 may be formed of the same or similar material as that of the first substrate SUB1, or may be formed of material different from that of the first substrate SUB1.

In an embodiment, the light conversion pattern layer LCP may include a first light conversion pattern layer LCP1 disposed to face the first sub-pixel SPX1, a second light conversion pattern layer LCP2 disposed to face the second sub-pixel SPX2, and a third light conversion pattern layer LCP3 disposed to face the third sub-pixel SPX3. In an embodiment, at least some or a predetermined number of the first, second, and third light conversion pattern layers LCP1, LCP2, and LCP3 may include a color conversion layer CCL and/or a color filter CF.

For example, the first light conversion pattern layer LCP1 may include a first color conversion layer CCL1 including first color conversion particles corresponding to a first color, and a first color filter CF1 that may allow light of the first color to selectively pass therethrough. Similarly, the second light conversion pattern layer LCP2 may include a second color conversion layer CCL2 including second color conversion particles corresponding to a second color, and a second color filter CF2 that may allow light of the second color to selectively pass therethrough. The third light conversion pattern layer LCP3 may include at least one of a light scattering layer LSL including light scattering particles SCT, and a third color filter CF3 that may allow light of a third color to selectively pass therethrough.

In an embodiment, the first, second, and third light emitting elements LD1, LD2, and LD3 may emit light of the same color. Furthermore, a color conversion layer CCL may be disposed on at least some or a predetermined number of the first, second, and third sub-pixels SPX1, SPX2, and SPX3. For example, first and second color conversion layers CCL1 and CCL2 may be respectively disposed on the first and second sub-pixels SPX1 and SPX2. Consequently, the display device in accordance with an embodiment may display a full-color image.

In an embodiment, the first color conversion layer CCL1 may be disposed on one surface of the second substrate SUB2 to face the first sub-pixel SPX1 and include first color conversion particles which convert the color of light emitted from the first light emitting elements LD1 to a first color. For example, in the case where the first light emitting elements LD1 are blue light emitting elements (e.g., LD1(B)) that may emit blue light and the first sub-pixel SPX1 are red sub-pixels, the first color conversion layer CCL1 may include red quantum dots QDr which convert blue light emitted from the first light emitting elements LD1 to red light. For example, the first color conversion layer CCL1 may include a plurality of red quantum dots QDr which are distributed in predetermined matrix material such as transparent resin. The red quantum dot QDr may absorb blue light and shift the wavelength of light according to an energy transition, thus emitting red light having a wavelength ranging from about 620 nm to about 780 nm. In the case where the first sub-pixel SPX1 is one of sub-pixels of other colors, the first color conversion layer CCL1 may include first quantum dots corresponding to the color of the first sub-pixel SPX1.

In an embodiment, the first color filter CF1 may be disposed between the first color conversion layer CCL1 and the second substrate SUB2 and include color filter material which allows light of the first color converted by the first color conversion layer CCL1 to selectively pass therethrough. For example, in the case where the first color conversion layer CCL1 may include red quantum dots QDr, the first color filter CF1 may be a red color filter that may allow red light to selectively pass therethrough.

In an embodiment, the second color conversion layer CCL2 may be disposed on one surface of the second substrate SUB2 to face the second sub-pixel SPX2 and include second color conversion particles which convert the color of light emitted from the second light emitting elements LD2 to a second color. For example, in the case where the second light emitting elements LD2 are blue light emitting elements (e.g., LD2(B)) that may emit blue light and the second sub-pixel SPX2 are green sub-pixels, the second color conversion layer CCL2 may include green quantum dots QDr which convert blue light emitted from the second light emitting elements LD2 to green light. For example, the second color conversion layer CCL2 may include a plurality of green quantum dots QDg which are distributed in predetermined matrix material such as transparent resin. The green quantum dot QDg may absorb blue light and shift the wavelength of light according to an energy transition, thus emitting green light having a wavelength ranging from about 500 nm to about 570 nm. In the case where the second sub-pixel SPX2 is one of sub-pixels of other colors, the second color conversion layer CCL2 may include second quantum dots corresponding to the color of the second sub-pixel SPX2.

Each of the first and second quantum dots (or red and green quantum dots QDr and QDg) may be selected from among a group II-IV compound, a group IV-VI compound, a group IV element, a group IV compound, and a combination thereof.

The group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The first and second quantum dots may have a full width of half maximum (FWHM) of an emission wavelength spectrum of about 45 nm or less, and light emitted through the first and second quantum dots may be emitted in all directions. Consequently, the viewing angle of the light emitting display device may be enhanced.

Each of the first and second quantum dots may be in the form of a nanoparticle, a nanotube, a nanowire, nanofiber, a planar nanoparticle having a substantially spherical shape, a substantially pyramid shape, a substantially multi-arm shape, or a substantially cubic shape, but it is not limited thereto. In other words, the shapes of the first and second quantum dots may be changed in various ways.

In an embodiment, in a case that blue light having a comparatively short wavelength in a visible ray area is incident on each of the red and green quantum dots QDr and QDg, the absorption coefficient of the red and green quantum dots QDr and QDg may be increased. Thereby, eventually, the efficiency of light emitted from the first and second sub-pixels SPX1 and SPX2 may be enhanced, and satisfactory color reproducibility may be secured. Furthermore, the first, second, and third light emitting elements LD1, LD2, and LD3 respectively disposed in the first, second, and third sub-pixel areas SPA1, SPA2, and SPA3 may have the same color, for example, blue. Hence, the production efficiency of the display device may be enhanced.

In an embodiment, the second color filter CF2 may be disposed between the second color conversion layer CCL2 and the second substrate SUB2 and include color filter material which allows light of the second color converted by the second color conversion layer CCL2 to selectively pass therethrough. For example, in the case where the second color conversion layer CCL2 may include green quantum dots QDg, the second color filter CF2 may be a green color filter that may allow green light to selectively pass therethrough.

In an embodiment, the light scattering layer LSL may be disposed on one surface of the second substrate SUB2 to face the third sub-pixel SPX3. For example, the light scattering layer LSL may be disposed on the third sub-pixel SPX3 and the third color filter CF3.

In an embodiment, in a case that the third light emitting elements LD3 may be blue light emitting elements that may emit blue light and the third sub-pixel SPX3 may be a blue sub-pixel, the light scattering layer LSL may be selectively provided to efficiently use light emitted from the third light emitting elements LD3. The light scattering layer LSL may include at least one kind of light scattering particles SCT. For example, the light scattering layer LSL may include light scattering particles SCT such as $TiO_2$ or silica. For example, the light scattering layer LSL may include a plurality of light scattering particles SCT which may be distributed in predetermined matrix material such as transparent resin. In the disclosure, the material of the light scattering particles SCT is not particularly limited, and the light scattering layer LSL may be formed of various materials. Here, the light scattering particles SCT may be disposed in areas other than the third sub-pixel area SPA3. For example, the light scattering particles SCT may be selectively included in the first and/or second color conversion layer CCL1 and/or CCL2.

In an embodiment, the third color filter CF3 may be disposed on one or a surface of the second substrate SUB2 to face the third sub-pixel SPX3 and may include color filter material which allows light of the third color emitted from the third light emitting elements LD3 to selectively pass therethrough. For example, in the case where the third light emitting elements LD3 are blue light emitting elements (e.g., LD3(B)) that may emit blue light, the third color filter CF3 may be a blue color filter that may allow blue light to selectively pass therethrough.

In an embodiment, a black matrix BM may be disposed between the first, second, and third color filters CF1, CF2, and CF3. For example, the black matrix BM may be disposed on the second substrate SUB2 to overlap with the bank BNK on the first substrate SUB1.

In the foregoing embodiments, each pixel PXL using light emitting elements LD for emitting the same color and a display device including the same may be easily manufactured. Since the color conversion layer CCL is disposed on at least some or a predetermined number of the sub-pixels SPX, full-color pixels PXL and a display device including the same may be manufactured.

Figure 11:
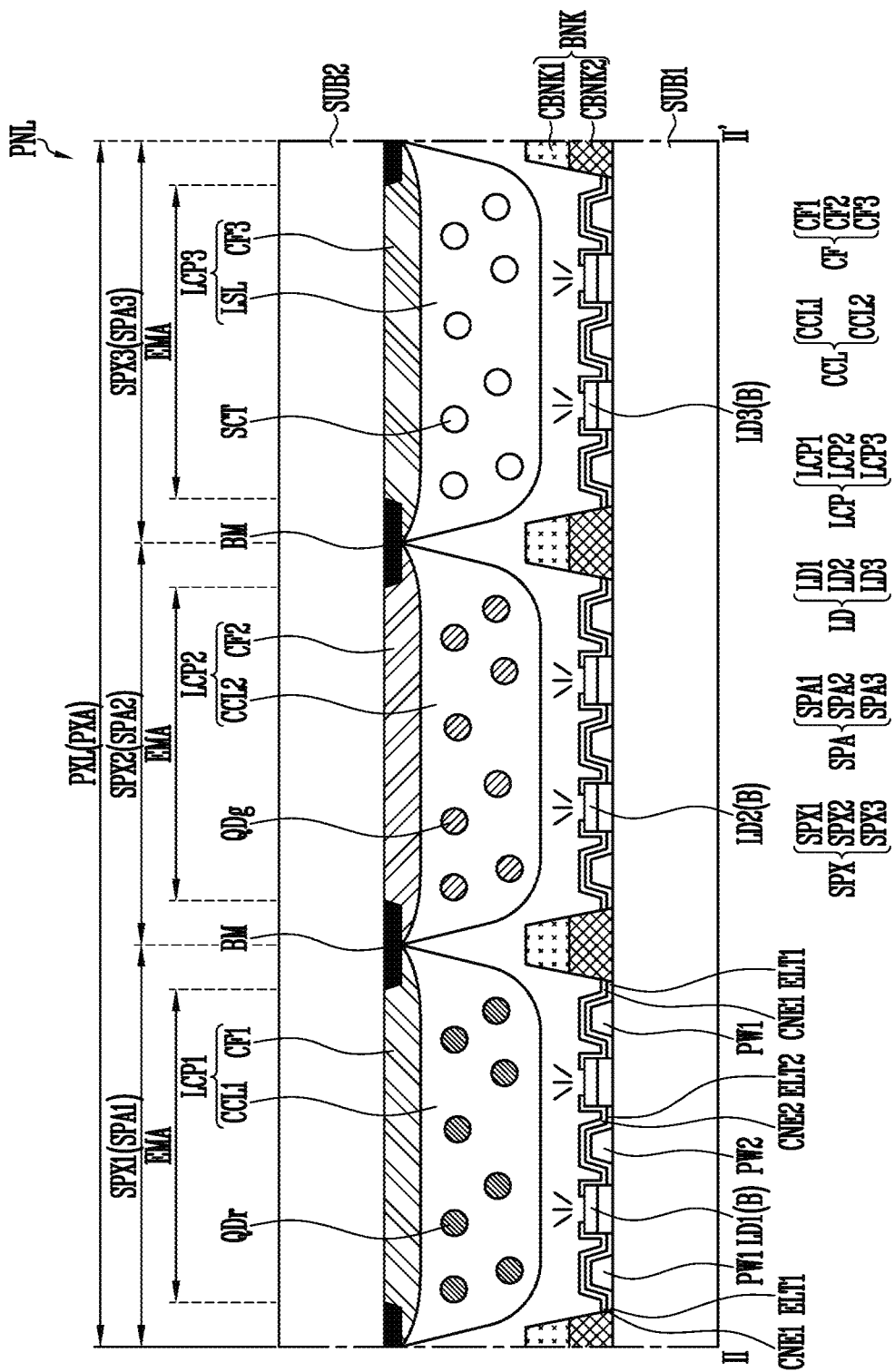
FIGS. 11 and 12 are sectional diagrams each illustrating the structure of a display device in accordance with an embodiment and, for example, illustrate embodiments of a cross-section corresponding to line II-II' of FIG. 6.
Figure 12:
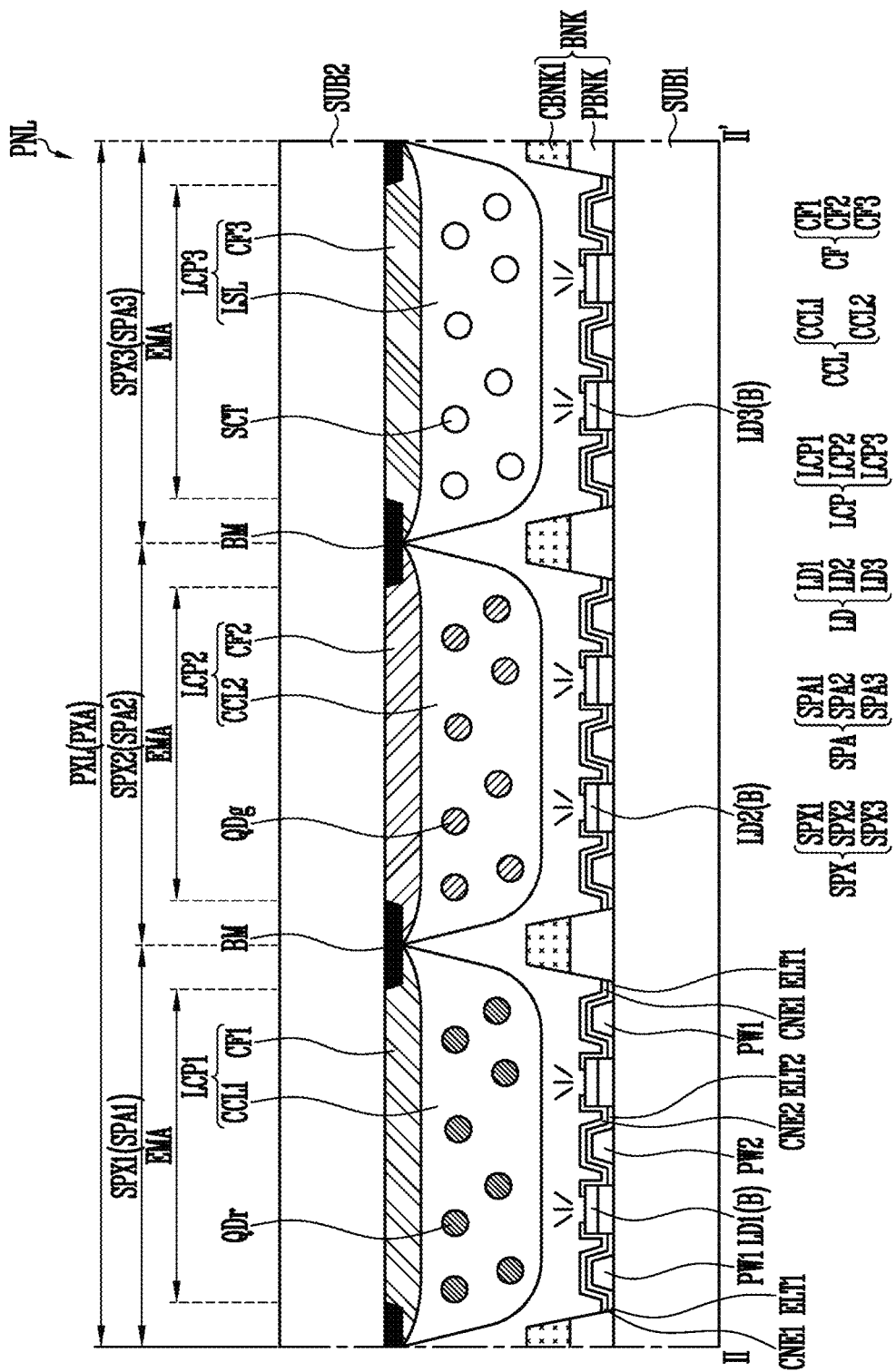

FIGS. 11 and 12 are sectional diagrams each illustrating the structure of a display device in accordance with an embodiment and, for example, illustrate embodiments of a cross-section corresponding to line II-II' of FIG. 6. In detail, FIGS. 11 and 12 illustrate different modified embodiments of the bank BNK illustrated in FIGS. 6 to 10. In the description of an embodiment of FIGS. 11 and 12, like reference numerals are used to designate components similar or equal to those of the above-described embodiments, for example, embodiments of FIG. 10, and detailed explanation thereof may be omitted.

Referring to FIGS. 11 and 12, the bank BNK may be formed of multiple layers. For example, as illustrated in FIG. 11, the bank BNK may include a first color bank layer CBNK1 and a second color bank layer CBNK2 which are disposed on one surface of the first substrate SUB1 to overlap with each other.

In an embodiment, the first color bank layer CBNK1 may be disposed in one area on the first substrate SUB1, for example, between the emission areas EMA, and include a first color pigment. The second color bank layer CBNK2 may be disposed over or under or below the first color bank layer CBNK1 to overlap with the first color bank layer CBNK1 and include a second color pigment having a color different from that of the first color pigment. In an embodiment, the first color bank layer CBNK1 and the second color bank layer CBNK2 each may include at least one color of color pigment, and may include, depending on embodiments, a combination of a plurality of colors of color pigments.

In an embodiment, as illustrated in FIG. 12, the bank BNK may include a first color bank layer CBNK1 and a polymer organic bank layer PBNK which are disposed on one surface of the first substrate SUB1 to overlap with each other. For example, the bank BNK may include the first color bank layer CBNK1 including a first color pigment, and a polymer organic bank layer PBNK disposed over or under or below the first color bank layer CBNK1 and including polymer organic material such as polyimide PI.

In the disclosure, the structure and/or the composition material of the bank BNK may be changed in various ways. For example, the bank BNK may include at least one color bank layer (for example, a first color bank layer CBNK1) including at least one color of color pigment, and the structure, the shape, for example of the bank BNK may be changed in various ways.

As described above, the display device according to various embodiments may include the bank BNK enclosing each emission area EMA in which at least one light emitting element LD is disposed. By way of example, in an embodiment, the bank BNK may be formed of the color bank CBNK including color filter material which may block light of the color emitted from each light emitting element LD. For example, as illustrated in FIG. 10, the bank BNK may be a color bank CBNK formed of a single color bank layer. Alternatively, as illustrated in FIGS. 11 and 12, the bank BNK may have a multilayer structure including at least the first color bank layer CBNK1.

According to such embodiments, residues of the bank BNK may be prevented from remaining, and the bank BNK may be easily formed in a desired shape. Furthermore, the bank BNK may prevent light from leaking from the emission area EMA in a sideway direction, so that a color mixing phenomenon may be prevented from occurring between adjacent sub-pixels SPX.

For example, in an embodiment, at least one kind of color conversion layer is disposed on at least some or a predetermined number of emission areas EMA. For example, the first color conversion layer CCL1 may be disposed on the emission area EMA of the first sub-pixel SPX1, and the second color conversion layer CCL2 may be disposed on the emission area EMA of the second sub-pixel SPX2.

In such embodiments, a full-color display device using light emitting elements LD that may emit single-color light, for example, blue light, may be manufactured. In this case, there are various options of color pigments to be used to form the color bank CBNK, so that optical interference between adjacent sub-pixels SPX may be more effectively prevented.

In the above-mentioned embodiments, to clearly explain each of components disposed on the first substrate SUB1 and the second substrate SUB2, each sub-pixel SPX and the light conversion pattern layer LCP disposed on the sub-pixel SPX have been described being separate components, but the disclosure is not limited thereto. In other words, in an embodiment, each light conversion pattern layer LCP may be regarded as being included in each sub-pixel SPX.

In an embodiment, each sub-pixel SPX may form each light emitting device. For example, the first sub-pixel SPX1 corresponding to a red-sub pixel may form a red light emitting device, the second sub-pixel SPX2 corresponding to a green sub-pixel may form a green light emitting device, and the third sub-pixel SPX3 corresponding to a blue sub-pixel may form a blue light emitting device. The full-color pixel PXL including the first, second, and third sub-pixels SPX1, SPX2, and SPX3 may form a full-color light emitting device. In other words, embodiments are not limited to only a display device, and may be widely applied to other kinds of devices which need light sources.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
a first substrate including first, second, and third sub-pixel areas being disposed on a plane;
a first sub-pixel including a first light emitting element disposed in the first sub-pixel area and configured to emit red light;
a second sub-pixel including a second light emitting element disposed in the second sub-pixel area and configured to emit green light;
a third sub-pixel including a third light emitting element disposed in the third sub-pixel area and configured to emit blue light; and
a bank disposed between an emission area of each of the first, the second, and the third sub-pixels and configured to enclose the emission area of each of the first, the second, and the third sub-pixels and being adjacent to the first light emitting element, the second light emitting element, and the third light emitting element along a direction in which the plane extends, wherein
the first light emitting element, the second light emitting element, and the third light emitting element are configured to emit the blue light,
the bank is formed of a color bank including red- or yellow-based color filter material for blocking the blue light emitted from the first light emitting element, the second light emitting element, and the third light emitting element,
a color of the color filter material of the bank is identical,
the bank overlaps with the first light emitting element, the second light emitting element, and the third light emitting element along the direction, and
a height of the bank is greater than a height of the first, second, and third light emitting elements.

2. The display device according to claim 1, further comprising:
a second substrate located on one surface of the first substrate on which the first, the second, and the third sub-pixels are disposed;
a first color conversion layer disposed on one surface of the second substrate to face the first sub-pixel, and including first color conversion particles for converting a color of light emitted from the first light emitting element to a first color; and
a first color filter disposed between the second substrate and the first color conversion layer and configured to allow light of the first color to selectively pass therethrough,
wherein the first color filter does not overlap with the bank, the first light emitting element, the second light emitting element, and the third light emitting element along the direction.

3. The display device according to claim 2, further comprising:
a second color conversion layer disposed on one surface of the second substrate to face the second sub-pixel, and including second color conversion particles for converting a color of light emitted from the second light emitting element to a second color; and
a second color filter disposed between the second substrate and the second color conversion layer and configured to allow light of the second color to selectively pass therethrough,
wherein the second color filter does not overlap with the bank, the first light emitting element, the second light emitting element, and the third light emitting element along the direction.

4. The display device according to claim 3,
wherein the first color conversion layer and the second color conversion layer respectively include a red quantum dot and a green quantum dot, and
wherein the first color filter and the second color filter respectively comprise a red color filter and a green color filter.

5. The display device according to claim 3, further comprising at least one of:
a third color filter disposed on one surface of the second substrate to face the third sub-pixel and configured to allow light of a color emitted from the third light emitting element to selectively pass therethrough; and
a light scattering layer disposed between the third sub-pixel and the third color filter and including light scattering particles,
wherein the third color filter does not overlap with the bank, the first light emitting element, the second light emitting element, and the third light emitting element along the direction.

6. The display device according to claim 5,
wherein the third color filter comprises a blue color filter.

7. The display device according to claim 5, further comprising a black matrix disposed between the first, the second, and the third color filters.

8. The display device according to claim 1, wherein each of the first, the second, and the third sub-pixels comprises:
a first partition wall and a second partition wall disposed in the emission area and spaced apart from each other;
a first electrode disposed on the first partition wall;
a second electrode disposed on the second partition wall and spaced apart from the first electrode;
a first contact electrode disposed over a first end of the first, the second, or the third light emitting element and one area of the first electrode, and configured to electrically connect the first end to the first electrode; and
a second contact electrode disposed over a second end of the first, the second, or the third light emitting element and one area of the second electrode, and configured to electrically connect the second end to the second electrode.

9. The display device according to claim 8, wherein the first and the second partition walls each have a height less than a height of the bank.

10. The display device according to claim 8,
wherein the first electrode comprises a first reflective electrode protruding in a height direction of the first substrate and having an inclined surface or a curved surface facing the first end, and
wherein the second electrode comprises a second reflective electrode protruding in the height direction of the first substrate and having an inclined surface or a curved surface facing the second end.

11. The display device according to claim 1, wherein the bank comprises:
a first color bank layer disposed on one surface of the first substrate, and including a first color pigment; and
a second color bank layer disposed over or under the first color bank layer to overlap with the first color bank layer, and including a second color pigment having a color different from a color of the first color pigment.

12. The display device according to claim 1, wherein the bank comprises:
a first color bank layer disposed on one surface of the first substrate, and including a first color pigment; and
a polymer organic bank layer disposed over or under the first color bank layer to overlap with the first color bank layer.

13. The display device according to claim 1, wherein each of the first, the second, and the third light emitting elements comprises a rod-type light emitting diode having a nano-scale or micro-scale size.

14. A light emitting device comprising:
a first substrate including sub-pixel areas each including an emission region, being disposed on a plane, and the sub-pixel areas including a first sub-pixel area emitting red light, a second sub-pixel area emitting green light, and a third sub-pixel area emitting blue light;
a first partition wall and a second partition wall disposed in the emission area and spaced apart from each other;
a first electrode disposed on the first partition wall;
a second electrode disposed on the second partition wall and spaced apart from the first electrode;
a light emitting element disposed between the first electrode and the second electrode, configured to emit the blue light, and being disposed in each of the first sub-pixel area, the second sub-pixel area, and the third sub-pixel area; and
a bank disposed to enclose the emission area and being spaced apart from the light emitting element along a direction in which the plane extends, wherein the bank is formed of a color bank including a red- or yellow-based color filter material for blocking the blue light emitted from a first light emitting element, a second light emitting element, and a third light emitting element,
a color of the color filter material of the bank is identical,
the bank overlaps with the first light emitting element, the second light emitting element, and the third light emitting element along the direction, and
a height of the bank is greater than a height of the first, second, and third light emitting elements.

15. The light emitting device according to claim 14, further comprising:
a second substrate disposed on one surface of the first substrate;
a color conversion layer disposed on one surface of the second substrate and configured to face the light emitting element, and including color conversion particles for converting the color of light emitted from the light emitting element to a different color; and
a color filter configured to allow light of the color converted by the color conversion layer to pass therethrough.

16. The light emitting device according to claim 14, wherein the bank comprises:
a first color bank layer disposed on one surface of the first substrate, and including a first color pigment; and
a second color bank layer disposed over or under the first color bank layer to overlap with the first color bank layer, and including a second color pigment having a color different from a color of the first color pigment.

17. The light emitting device according to claim 14, wherein the bank comprises:
a first color bank layer disposed on one surface of the first substrate, and including a first color pigment; and
a polymer organic bank layer disposed over or under the first color bank layer to overlap with the first color bank layer.

* * * * *